United States Patent [19]

Nakagawa et al.

[11] Patent Number: 4,994,904
[45] Date of Patent: Feb. 19, 1991

[54] MOSFET HAVING DRAIN VOLTAGE DETECTION FUNCTION

[75] Inventors: Akio Nakagawa, Hiratsuka; Yoshihiro Yamaguchi, Urawa, both of Japan

[73] Assignee: Kabushiki Kaisha Toshiba, Kawasaki, Japan

[21] Appl. No.: 356,371

[22] Filed: May 24, 1989

[30] Foreign Application Priority Data

May 25, 1988 [JP] Japan ................................ 63-127403
Feb. 14, 1989 [JP] Japan .................................... 1-34404

[51] Int. Cl.$^5$ ..................... H01L 29/72; H01L 29/74; H01L 29/10; H01L 29/80
[52] U.S. Cl. ..................... 357/23.4; 357/36; 357/35; 357/38; 357/23.8; 357/22; 357/23.14
[58] Field of Search ............... 357/36, 35, 23.8, 22 E, 357/23.14, 23.4; 358/38

[56] References Cited

U.S. PATENT DOCUMENTS

| 4,344,081 | 8/1982 | Pao et al. | 357/43 |
| 4,553,084 | 11/1985 | Wrathall | 323/316 |
| 4,680,604 | 7/1987 | Nakagawa et al. | 357/23.4 |
| 4,823,173 | 4/1989 | Beasom | 357/22 |

FOREIGN PATENT DOCUMENTS 0267447  5/1988  European Pat. Off. .
60-254764  6/1985  Japan .

OTHER PUBLICATIONS

1982 IEDM Technical Digest, pp. 264-267; B. J. Baliga et al.
1983 IEDM Technical Digest, pp. 416-419; H. Wakaumi et al.

Primary Examiner—Rolf Hille
Assistant Examiner—Roy K. Potter
Attorney, Agent, or Firm—Oblon, Spivak, McClelland, Maier & Neustadt

[57] ABSTRACT

A MOSFET includes a base layer of a first conductivity type selectively formed in the surface layer of a high-resistance semiconductor layer, and a source layer of a second conductivity type selectively formed in the surface layer of the base layer. A drain layer of the second conductivity type is formed in the front or rear surface layer of the high-resistance semiconductor layer so as to be separated from the base layer by a predetermined distance. A gate insulating film is formed on the base layer, and a gate electrode is formed on the gate insulating film. A voltage detection terminal layer of the second conductivity type independent from the source layer is formed in the base layer. A voltage detection electrode is in contact with the voltage detection terminal layer.

17 Claims, 17 Drawing Sheets

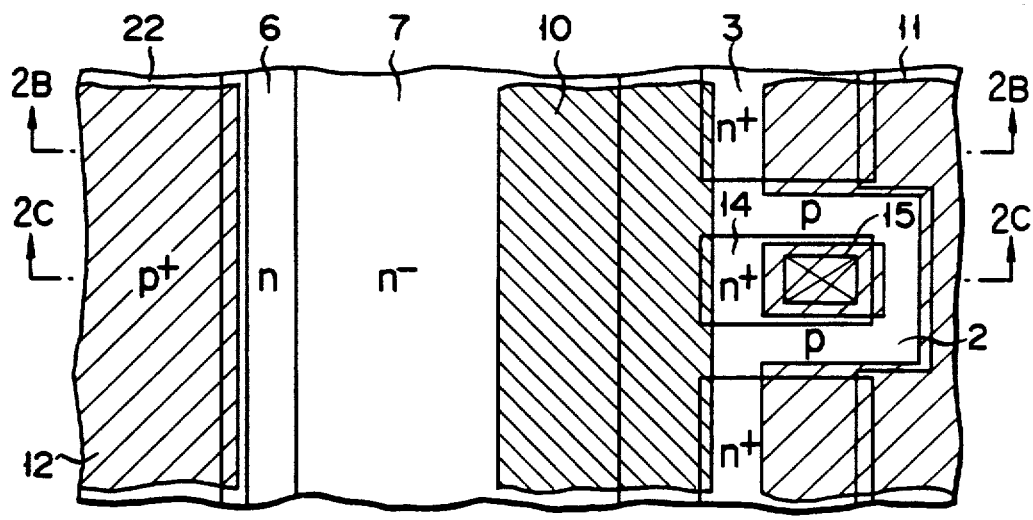
F I G. 2A
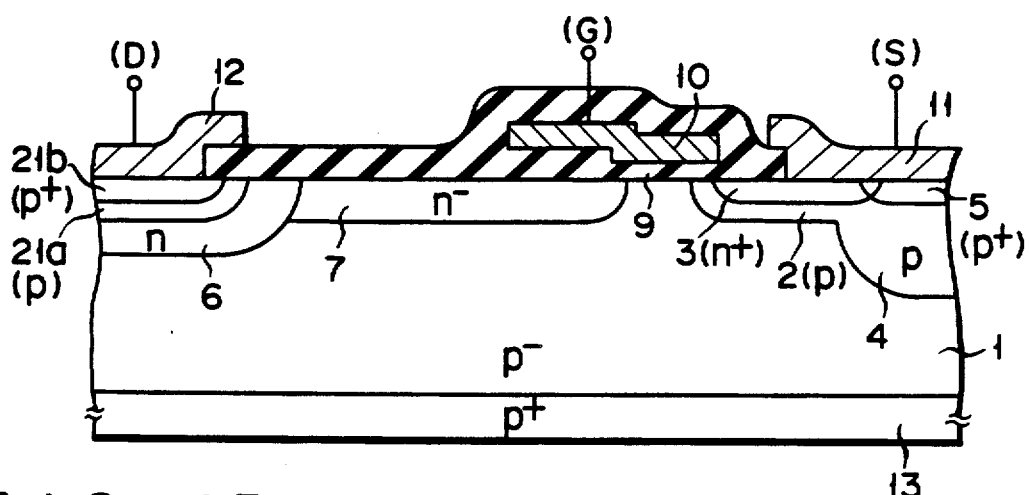
F I G. 2B
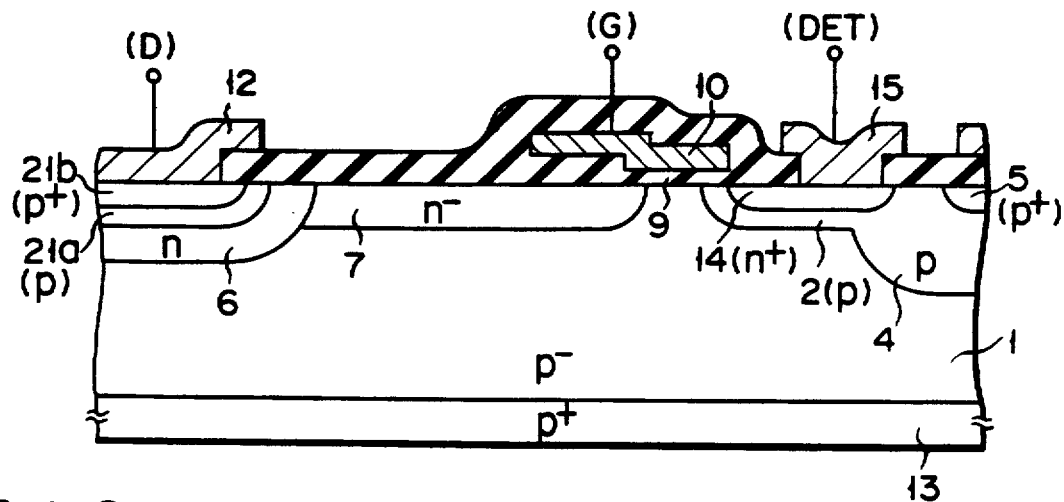
F I G. 2C

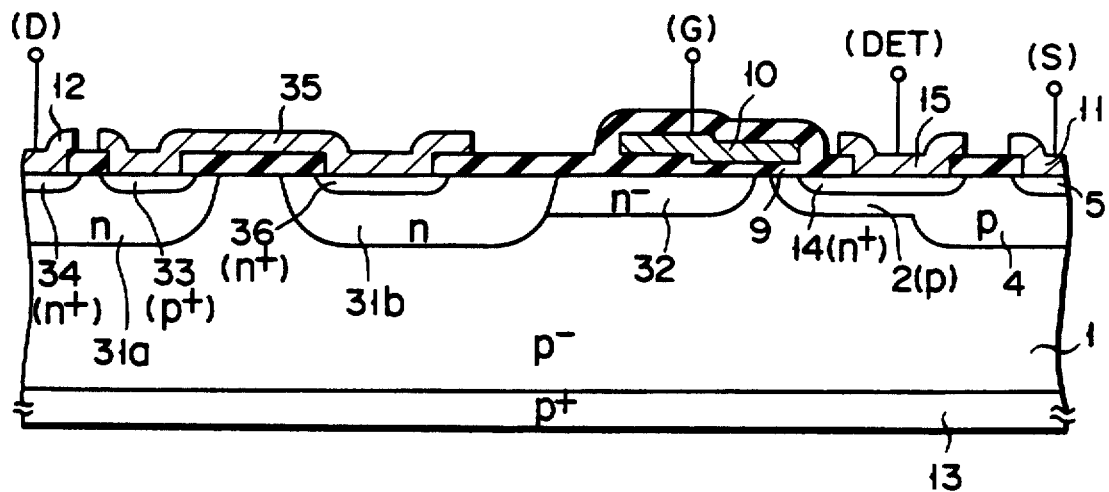
F I G. 6A
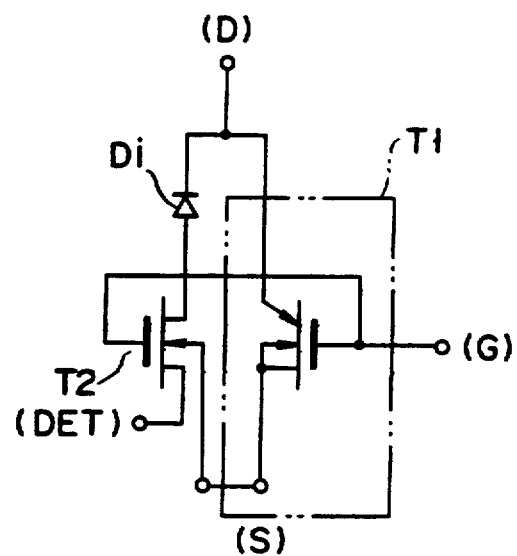
F I G. 6B

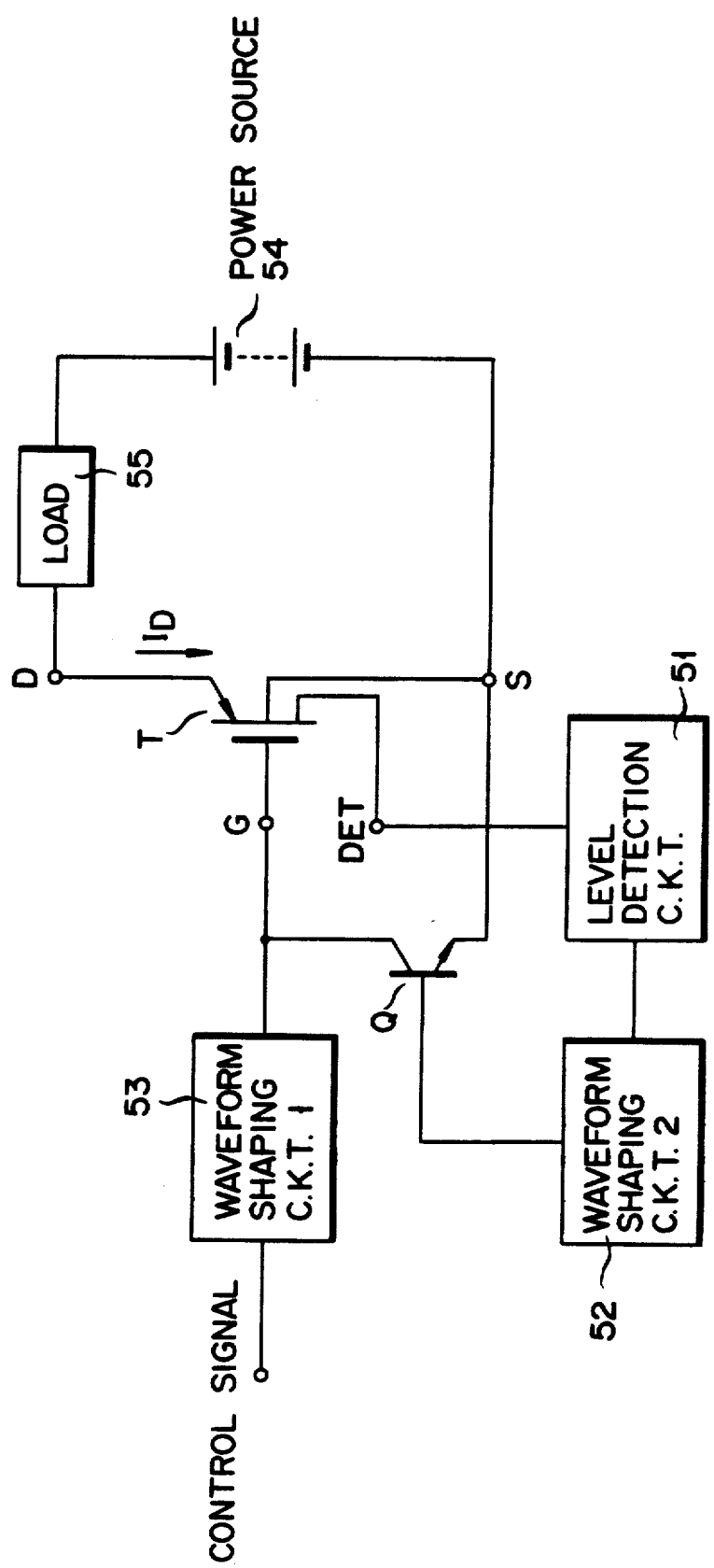
F I G. 13

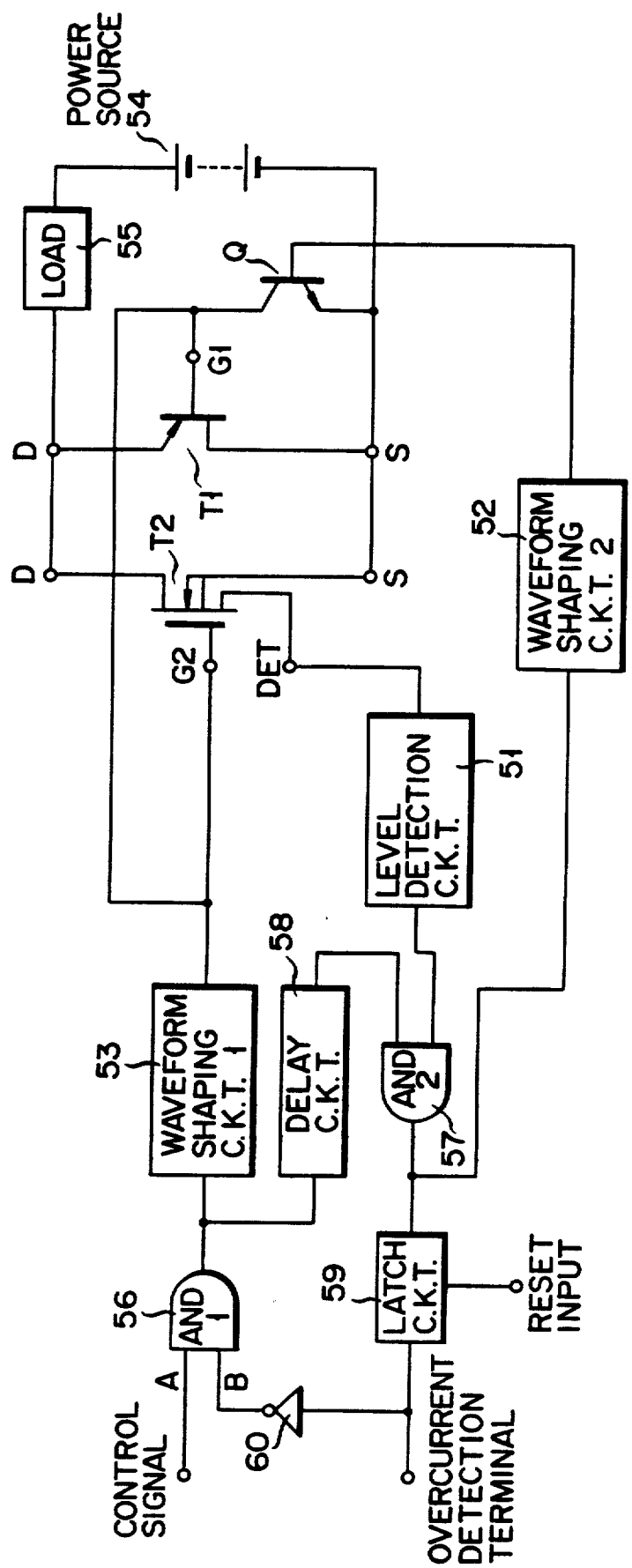
F I G. 15

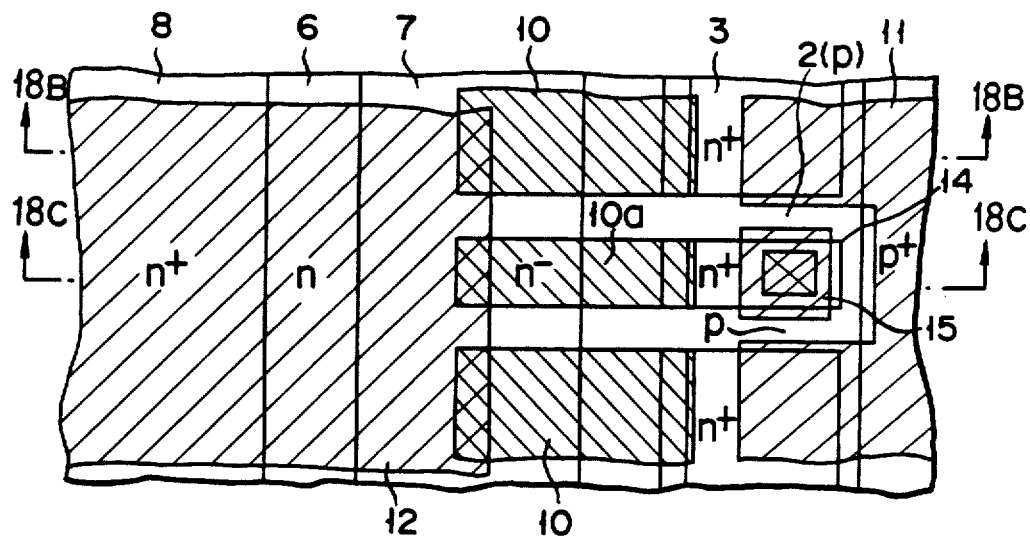
F I G. 18A
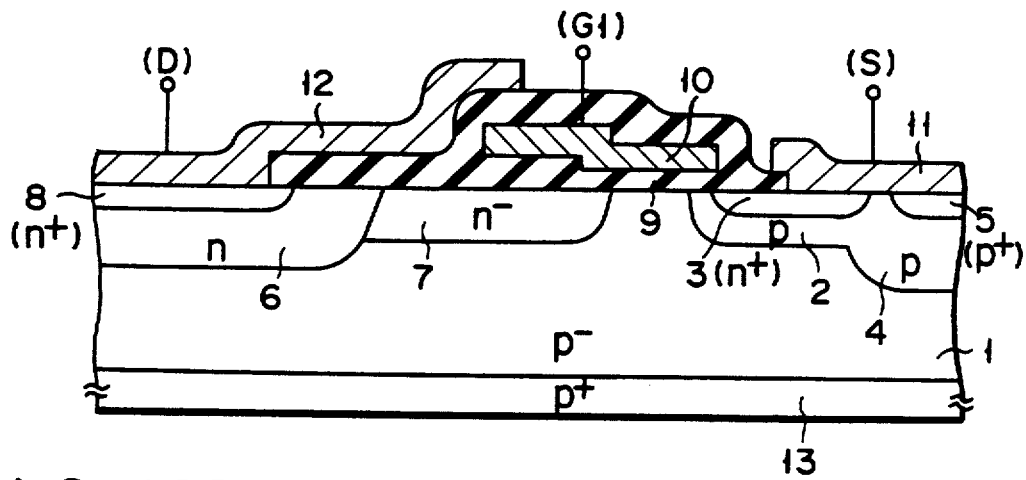
F I G. 18B
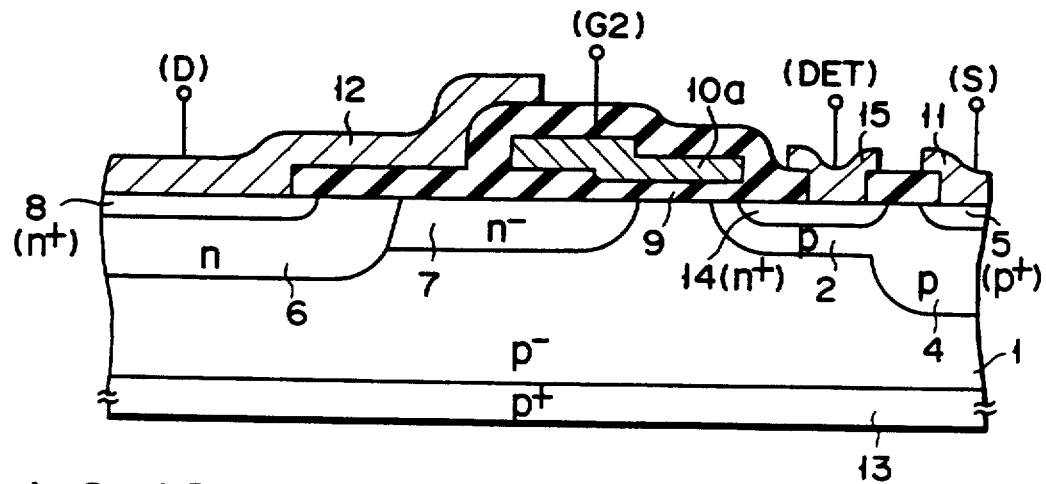
F I G. 18C

MOSFET HAVING DRAIN VOLTAGE DETECTION FUNCTION

BACKGROUND OF THE INVENTION

1. Field of the Invention

The present invention relates to a MOSFET having a drain voltage detection function.

2. Description of the Related Art

A protection circuit is conventionally incorporated in an integrated circuit to detect a current flowing through a MOSFET located at an output portion of the integrated circuit and to protect a main element against an overcurrent. In a known conventional method, a part of a source electrode is divided to be used as a current detection terminal, thereby detecting a current flowing through the MOSFET at the output portion More specifically, if the MOSFET is of an n-channel type, a p-type base layer is divided into a plurality of islands, and an n-type source layer is formed on each p-type base layer. A plurality of source and base layers are commonly connected to a source electrode. In such a structure, a specific source electrode portion of one p-type base layer is separated from the other p-type base layers so as to be used as an overcurrent detection electrode. With this arrangement, since the source electrode is not short-circuited to the detection electrode, the potential of the detection electrode increases independently of the potential of the source electrode with an increase in drain voltage. Therefore, by inserting, e.g., a resistor between the detection electrode and the ground potential and detecting a voltage drop across this resistor, a current flowing through the element can be detected.

In the case of, especially, a conductivitymodulation MOSFET, if a p-type base layer is divided into a plurality of islands, a latch-up withstand voltage is decreased. As a result, a current value capable of turning off the conductivity-modulation MOSFET is decreased. Therefore, it is preferred to continuously form a p-type base layer and continuously form a source layer in the p-type base layer. In such a structure, however, the above method of simply dividing a source electrode to form a detecting electrode cannot be used because the potential of the detection electrode is not independent from that of the source electrode.

As described above, the overcurrent detection method of dividing a source electrode to form a current detection electrode as used in the conventional output portion MOSFET is problematic because it cannot be applied to an element having a continuous p-type base layer.

SUMMARY OF THE INVENTION

It is an object of the present invention to provide a MOSFET having a continuous p-type base layer and a drain voltage detecting means capable of detecting a drain current with a simple structure.

According to a first aspect of the present invention, there is provided a MOSFET comprising a source layer of a second conductivity type formed in the surface layer of a base layer of a first conductivity type, wherein a voltage detection terminal layer of the second conductivity type is formed in the base layer of the first conductivity type so as to be isolated from the source layer of the second conductivity type, and a voltage detection electrode is formed in contact with the voltage detection terminal layer.

According to a second aspect of the present invention, there is provided a conductivity-modulation MOSFET having a source layer of a second conductivity type formed in the surface layer of a base layer of a first conductivity type, wherein a voltage detection terminal layer of the second conductivity type is formed in the base layer of the first conductivity type so as to be isolated from the source layer of the second conductivity type, and a voltage detection electrode is formed in contact with the voltage detection terminal layer.

According to a third aspect of the present invention, there is provided a conductivity-modulation MOSFET comprising a source layer of a second conductivity type formed in the surface layer of a base layer of a first conductivity type formed in a high-resistance semiconductor layer, wherein a voltage detection terminal layer of the first conductivity type not serving as a source layer is formed in the surface layer of the high-resistance semiconductor layer so as to be isolated from the base layer of the first conductivity type, and a voltage detection electrode is formed in contact with the voltage detection terminal layer.

Furthermore, according to the present invention, a main MOSFET to be protected and a drain voltage detection MOSFET for protecting the main MOSFET against an overcurrent are formed in an on-chip arrangement manner so that at least their drains are isolated from each other. Alternatively, the two MOSFETs are formed on different chips, and their source, gate and drain electrodes are commonly connected each other. In this case, a source layer of the drain voltage detection MOSFET is formed independently of a source layer of the main MOSFET so as to be used as a voltage detection terminal layer. Also, when a p-n junction diode is incorporated in the drain or source side of the drain voltage detection MOSFET, drain voltage detection can be performed by utilizing a breakdown voltage of the p-n junction diode.

The above MOSFET or conductivity-modulation MOSFET of the present invention may be of a lateral or vertical type.

According to the present invention, a voltage detection terminal layer of a second conductivity type is formed in a base layer of a first conductivity type so as to be isolated from a source layer of the second conductivity type, and a voltage detection electrode is formed in contact with the voltage detection terminal layer. With this arrangement, even if a source electrode and the base layer of the first conductivity type are grounded when a MOSFET is turned on, the potential of the voltage detection terminal layer increases through a channel as a drain voltage increases. Therefore, the drain voltage can be detected by the voltage detection electrode, and a drain current can be indirectly monitored. By inserting a resistor between the voltage detection electrode and the ground electrode, the magnitude of the drain current can be detected. The above technique can be applied to either a normal MOSFET or conductivity-modulation MOSFET. Especially in a conductivity-modulation MOSFET in which a base layer of a first conductivity type is not divided but continuously formed in order to prevent latch-up, a voltage detection terminal layer must be formed independently of a source layer as in the present invention. By simply dividing a source electrode as in the conventional method, a drain current cannot be monitored. The present invention is effective in this respect.

In a conductivity-modulation MOSFET, unlike in a normal MOSFET, a hole current flows simultaneously with an electron current even if the conductivity-modulation MOSFET is of an n-channel type. Therefore, a voltage detection terminal layer of a first conductivity type and not having a source layer is formed independently of a base layer of the first conductivity type. By forming a voltage detection electrode in the voltage detection terminal layer of the first conductivity type, a drain current can be monitored.

BRIEF DESCRIPTION OF THE DRAWINGS

Other objects and advantages will be apparent from the following description taken in conjunction with the accompanying drawings in which:

FIG. 2A is a plan view showing a structure of a lateral conductivity-modulation MOSFET according to a second embodiment of the present invention;

FIG. 2B is a sectional view taken along a line IIB—IIB of FIG. 2A;

FIG. 2C is a sectional view taken along a line IIC—IIC of FIG. 2A;

FIG. 6A is a sectional view showing a main structure of a conductivity-modulation MOSFET according to a sixth embodiment of the present invention;

FIG. 6B is an equivalent circuit diagram of the conductivity-modulation MOSFET shown in FIG. 6A;

FIG. 13 is a circuit diagram showing a MOSFET device including a protection circuit according to an 11th embodiment of the present invention;

FIG. 15 is a circuit diagram showing a MOSFET device including a protection circuit according to a 12th embodiment of the present invention;

FIG. 18A is a plan view showing a main structure of a MOSFET according to a 14th embodiment of the present invention;

FIG. 18B is a sectional view taken along a line XVIIIB—XVIIIB of FIG. 18A;

FIG. 18C is a sectional view taken along a line XVIIIC—XVIIIC of FIG. 18A; and

DETAILED DESCRIPTION OF THE PREFERRED EMBODIMENTS

Figure 1A:
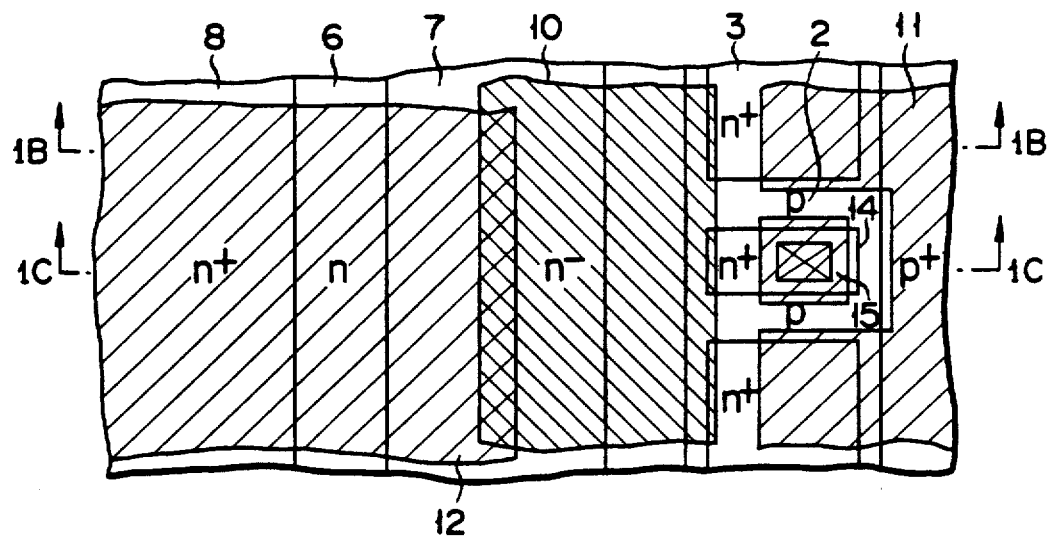
FIG. 1A is a plan view showing a main structure of a MOSFET according to a first embodiment of the present invention.

Embodiments of the present invention will be described in detail below with reference to the accompanying drawings. In the embodiments, a first conductivity type corresponds to a p type, and a second conductivity type corresponds to an n type. In all the embodiments, an n-channel MOSFET will be described.

A MOSFET according to a first embodiment of the present invention will be described below with reference to FIGS. 1A, 1B and 1C. A high-resistance $p^-$-type Si layer 1 is formed on a $p^+$-type silicon substrate 13 by epitaxial growth, and a p-type base layer 2 is selectively formed in the surface layer of the Si layer 1. An $n^+$-type source layer 3 is formed in the surface layer of the base layer 2. A low-resistance p-type layer 4 is formed at a portion of the base layer 2 separated from a channel region, and a $p^+$-type contact layer 5 is formed in p-type layer 4. An n-type buffer layer 6 is formed at a position in the surface layer of the Si layer 1 separated from the base layer 2 by a predetermined distance, and an $n^+$-type drain layer 8 is formed in n-type buffer layer 6. An $n^-$-type drift layer 7 extending from the buffer layer 6 to a channel side is formed in the surface layer of the Si layer 1. A gate insulating film 9 is formed across the base layer 2 and the drift layer 7, and a gate electrode 10 is formed thereon. A source electrode 11 is in contact with the source layer 3 and the contact layer 5. A drain electrode 12 is in contact with the drain layer 8 such that a part of the drain electrode 12 overlaps the gate electrode 10. An n+-type voltage detection terminal layer 14 is formed in the base layer 2 so as to be isolated from the source layer 3, and a voltage detection electrode 15 is in contact therewith.

A drain current detection operation in the MOSFET having the above arrangement is performed as follows. That is, the ground potential, for example, is applied on the source electrode 11, and predetermined positive voltages are applied on the gate and drain electrodes 10 and 12, respectively. As a result, the surfaces of the Si and base layers 1 and 2 located below the gate electrode 10 are inverted to form a channel, and a drain current flows through this channel. At this time, since the terminal layer 14 is separated from the source layer 3, it is affected by the drain voltage to have a positive potential. For this reason, the drain voltage can be detected by the detection electrode 15, and therefore a drain current can be indirectly detected. When the potential of the terminal layer 14 exceeds a difference between the gate voltage and a threshold value of the MOSFET element, the channel disappears. Therefore, the potential of the terminal layer 14 does not rise to exceed the difference between the gate voltage and the threshold value of the MOSFET element. For this reason, by applying the potential of the terminal layer 14 on, e.g., a logic circuit integrally formed on the same substrate of the MOSFET, overcurrent detection can be performed. When a resistor is inserted between the detection electrode 15 and the ground terminal (e.g., the source electrode 11), an output voltage corresponding to the drain current can be obtained.

In this manner, according to this embodiment, since the n+-type voltage detection terminal layer 14 is formed in the p-type base layer 2 so as to be isolated from the n+-type source layer 3, overcurrent detection of the MOSFET can be easily performed.

A conductivity-modulation MOSFET according to the present invention will be described with reference to FIGS. 2A, 2B and 2C. Referring to FIGS. 2A, 2B and 2C, the same reference numerals as in FIGS. 1A, 1B and 1C denote the same parts, and a detailed description thereof will be omitted. The arrangement in FIGS. 2A, 2B and 2C is different from that in FIGS. 1A, 1B and 1C in that a drain layer 21 consists of a p-type layer 21a and an p+-type layer 21b. An n-type layer 6 serves as a base layer. As is well known, in a conductivitymodulation MOSFET, upon an ON operation, an electron current is injected from the source layer 3 to n-type buffer layer 6 through channel and n⁻-type drift layer 7, and holes are injected from the drain layer to p⁻-type layer 1 through n-type buffer layer 6. Since p⁻-type layer 1 is induced to be positive potential based on this hole injection, the above-mentioned electrons are directly injected to p⁻-type layer 1. Therefore, a low ON voltage can be obtained by the conductivity-modulation effect occurred in p⁻-type layer 1. In the second embodiment, an n+-type voltage detection terminal layer 14 is formed in a p-type base layer 2 in addition to an n+-type source layer 3 as in the above first embodiment. A voltage detection electrode 15 is in contact with the terminal layer 14. In the conductivity-modulation MOSFET, if the potential of the terminal layer 14 is lower than that of the source layer 3, a portion of the voltage detection terminal layer is latched up. Therefore, it is important to design the MOSFET such that the source potential becomes the lowest potential by, e.g., coupling the detection electrode 15 to the source electrode 11 via a resistance.

In the second embodiment, a drain current can also be detected as in the first embodiment.

Figure 1B:
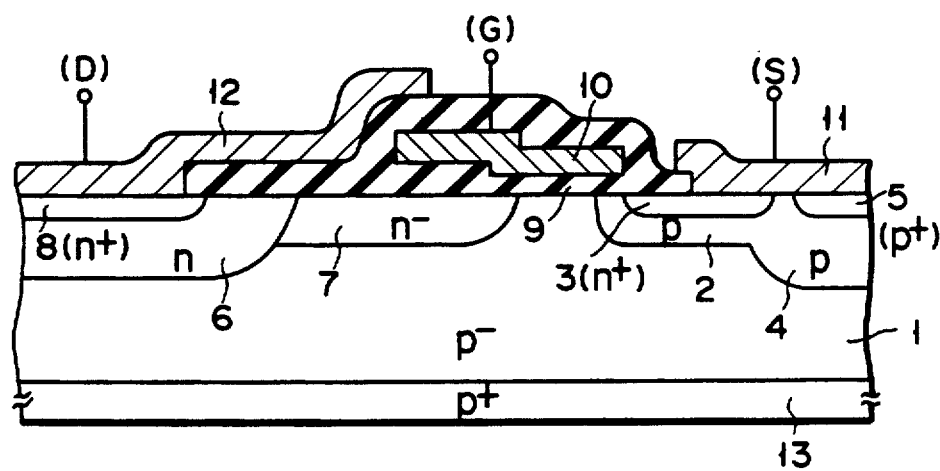
FIG. 1B is a sectional view taken along a line IB—IB of FIG. 1A.
Figure 1C:
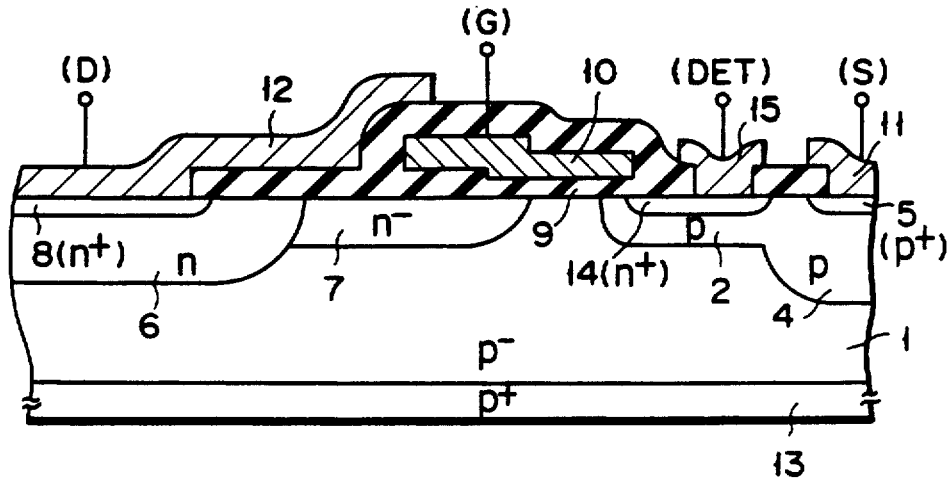
FIG. 1C is a sectional view taken along a line IC—IC of FIG. 1A.

Each of the normal MOSFET according to the first embodiment shown in FIGS. 1A, 1B and 1C and the conductivity-modulation MOSFET according to the second embodiment shown in FIGS. 2A, 2B and 2C is a lateral MOSFET in which the source, drain and gate are formed on one surface of a wafer. The present invention, however, can be applied to a vertical MOSFET in which the drain and source are formed on opposing surfaces of a wafer, respectively. That is, a drain current can be detected by forming an n+-type voltage detection terminal layer in a p-type base layer at a source layer side so as to be isolated from a source layer.

Figure 3A:
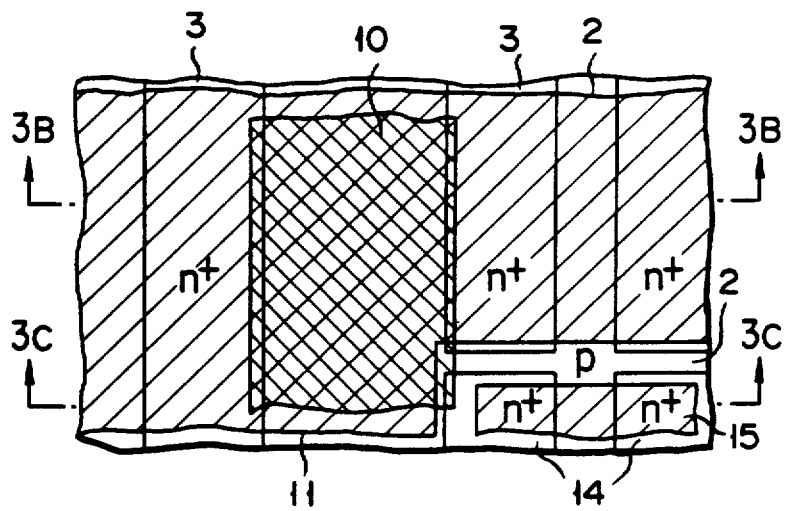
FIG. 3A is a plan view showing a main structure of a vertical conductivity-modulation MOSFET according to a third embodiment of the present invention.
Figure 3B:
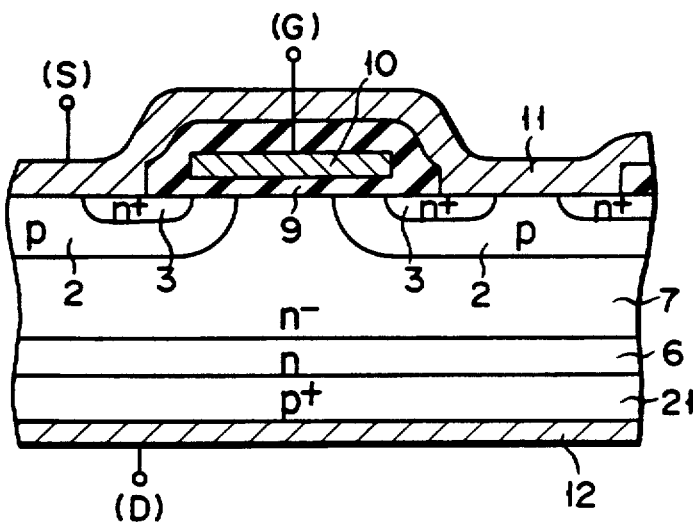
FIG. 3B is a sectional view taken along a line IIIB—IIIB of FIG. 3A.
Figure 3C:
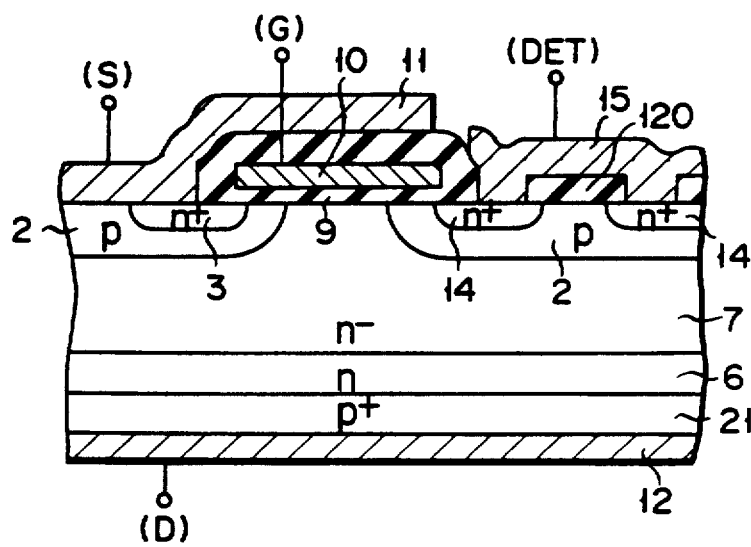
FIG. 3C is a sectional view taken along a line IIIC—IIIC of FIG. 3A.

FIGS. 3A, 3B and 3C show a vertical conductivitymodulation MOSFET according to a third embodiment of the present invention. Referring to FIGS. 3A, 3B and 3C, the same reference numerals as in FIGS. 2A, 2B and 2C denote the same parts, and a detailed description thereof will be omitted. In this embodiment, an n⁻-type base layer 7 corresponds to an n⁻-type drift layer 7 in the embodiment shown in FIGS. 2A, 2B and 2C and serves as a wafer. A p-type base layer 2 is selectively formed in the surface layer of the base layer 7. An n-type buffer layer 6 is formed below the base layer 7, and a p+-type drain layer 2 is formed therebelow. An n+-type voltage detection terminal layer 14 is formed in the base layer 2, in which the source layer 3 is formed, so as to be isolated from the source layer 3. A voltage detection electrode 15 is in contact with the terminal layer 14. The voltage detection electrode 15 is electrically isolated from p-type base layer 2 by on insulating film 120.

In the third embodiment, a drain current can also be detected as in the above embodiments. In order to sufficiently increase a latch-up withstand voltage, it is preferred to continuously form a p-type base layer 2 in the surface of a wafer and set the potential of the base layer 2 together with the continuous source layer at the source potential. The present invention is effective in the MOSFET having such an arrangement. That is, the terminal layer 14 is formed independently of the source layer 3, and the detection electrode 15 is in contact with only the terminal layer 14. Therefore, the potential of the detection electrode 15 can rise in accordance with the drain potential and regardless of the source potential.

Figure 4:
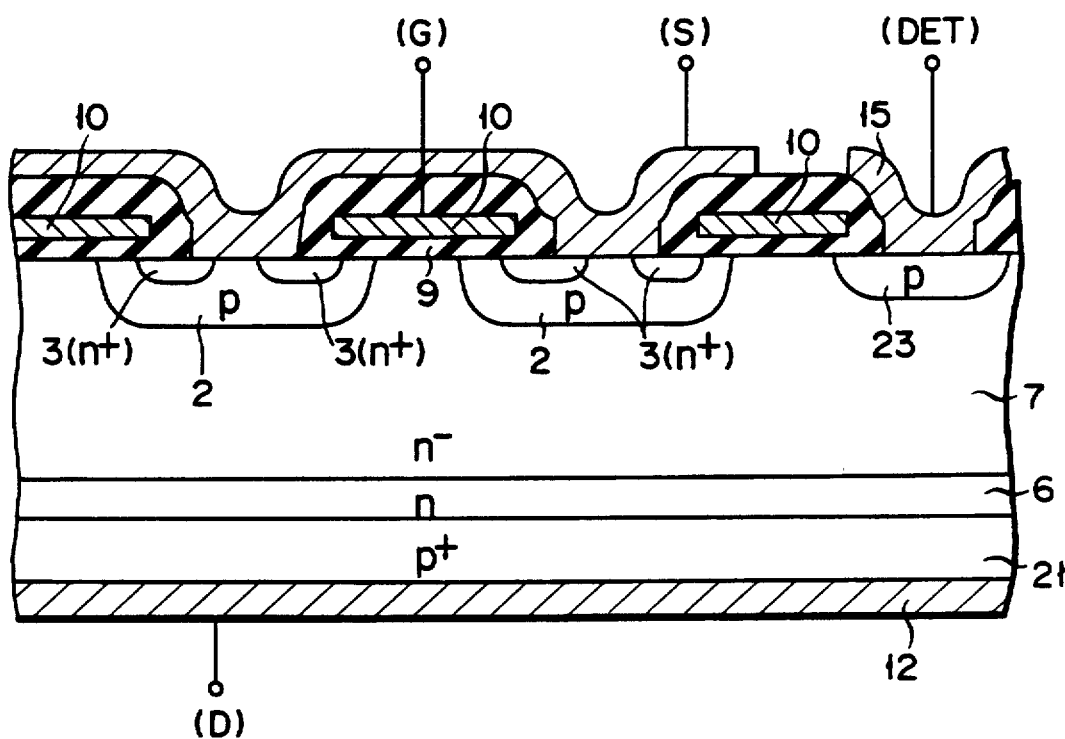
FIG. 4 is a sectional view showing a main structure of a conductivity-modulation MOSFET according to a fourth embodiment of the present invention.

FIG. 4 is a sectional view showing a conductivitymodulation MOSFET according to a fourth embodiment of the present invention. Referring to FIG. 4, the same reference numerals as in FIGS. 3A, 3B and 3C denote the same parts, and a detailed description thereof will be omitted. As described above, electron and hole currents exist in the conductivity-modulation MOSFET. Therefore, unlike in a normal MOSFET, a drain current can be detected by forming a p-type base layer without an n+-type source layer. FIG. 4 shows the embodiment having such an arrangement. A p-type voltage detection terminal layer 23, separated from a p-type base layer 2, and not having a source layer, is formed in the surface layer of an n⁻-type base layer 7. A voltage detection electrode 15 is formed on the terminal layer 23. The terminal layer 23 is isolated from the base layer 2.

A hole current flowing from a drain layer 21 upon turning on of the conductivity-modulation MOSFET can be detected by the terminal layer 23. Therefore, an amount of a drain current can be detected. Although the terminal layer 23 is formed independently of the base layer 2, no latch-up occurs in the terminal layer 23 because no n+-type layer exists in the terminal layer 23. For this reason, also in the fourth embodiment, overcurrent detection can be performed as in the above embodiments.

In each of the above embodiments, a voltage detection terminal layer is formed at a part of a MOSFET. According to the present invention, however, a drain layer of a MOSFET to be protected against an overcurrent can be formed independently of a drain layer of a detection MOSFET for detecting the overcurrent. Embodiments having such an arrangement will be described below.

Figure 5A:
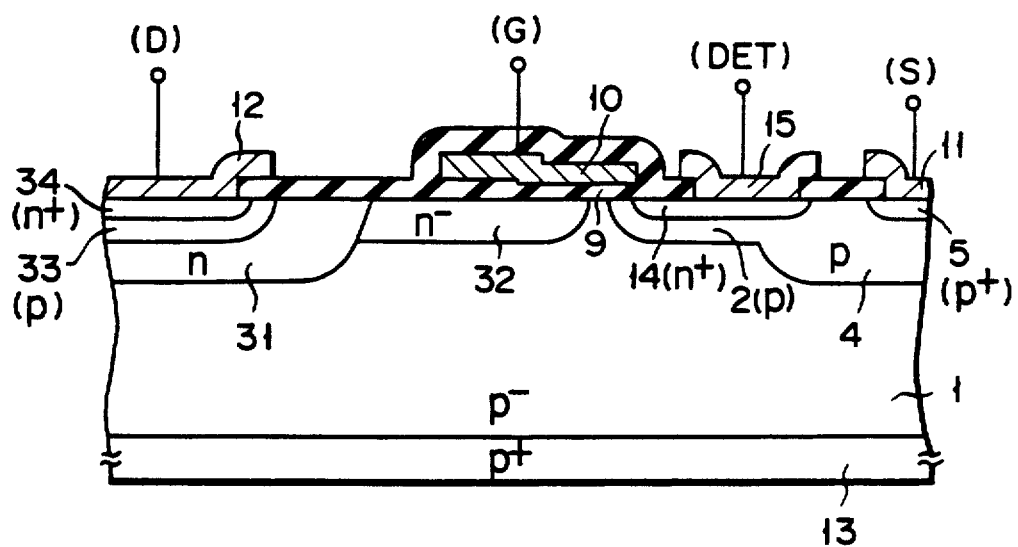
FIG. 5A is a sectional view showing a main structure of a conductivity-modulation MOSFET having an overcurrent detection MOSFET incorporating a diode according to a fifth embodiment of the present invention.
Figure 5B:
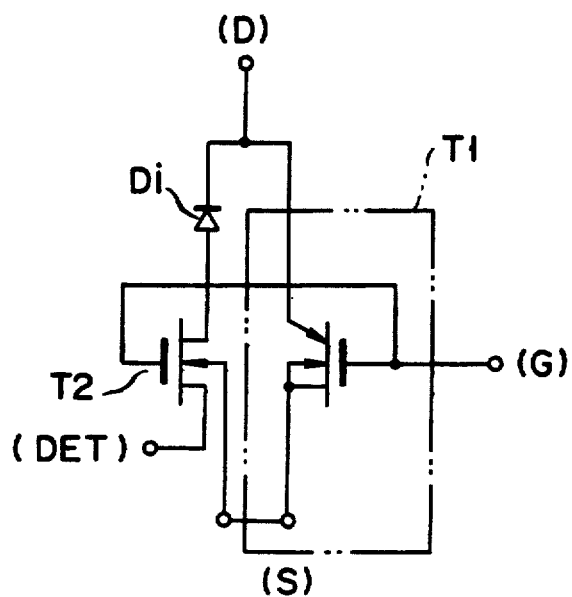
FIG. 5B is an equivalent circuit diagram of the conductivity-modulation MOSFET shown in FIG. 5A.

FIGS. 5A and 5B show a main structure of a MOSFET according to a fifth embodiment of the present invention and its equivalent circuit, respectively. In this embodiment, as shown in FIG. 5B, a main MOSFET T1 to be protected and an overcurrent detection MOSFET T2 are formed independently of each other in a p⁻-type high-resistance silicon layer 1. The MOSFET T1 is a conductivitymodulation MOSFET having an arrangement as shown in FIG. 2B. The MOSFET T1, however, may be a normal MOSFET. The MOSFETs T1 and T2 have a common p-type base layer 4. The MOSFET T2 is arranged as shown in FIG. 5A. That is, an n+-type source layer 14 is formed in the surface layer of a p-type base layer 2 so as to be isolated from a source layer of the MOSFET T1. A voltage detection electrode 15 is formed to allow the source layer 14 to serve as a voltage detection terminal layer. An n-type drain layer 31 and an n⁻-type drift layer 32 are formed in addition to the drain of the MOSFET T1. A p-type layer 33 is formed in the surface layer of the drain layer 31, and an n+-type layer 34 is formed in its surface layer. The layers 33 and 34 constitute a p-n junction diode Di. Source, gate and drain electrodes 11, 10 and 12 are common for the MOSFETs T1 and T2. The p-n junction diode Di is incorporated between the drain layer 31 and the drain electrode 12 of the MOSFET T2. The MOSFET T2 requires only a current capacity much smaller than that of the MOSFET T1. That is, a gate width of the MOSFET T2 can be smaller than that of the MOSFET T1.

When an overcurrent flows through the conductivitymodulation MOSFET having the above arrangement, a voltage between the drain (D) and source (S) rises. When this voltage exceeds a breakdown voltage of the diode Di, the voltage is output to the detection electrode 15 of the overcurrent detection MOSFET T2 via the diode Di. In this manner, the overcurrent can be detected. In the fifth embodiment, therefore, a main element for performing overcurrent detection is the p-n junction diode Di. The MOSFET T2 connected in series with the diode Di suppresses a rise in level obtained in the detection electrode 15.

Figure 11:
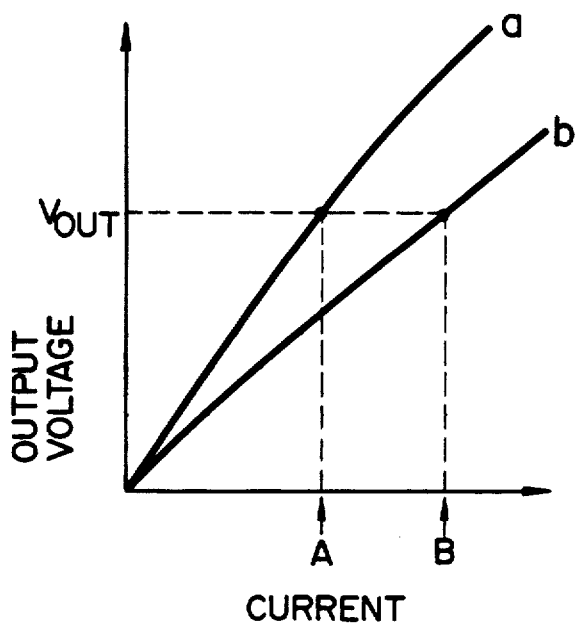
FIG. 11 is a graph for explaining a problem posed when current detection is performed by using a resistor.

When overcurrent detection is to be performed by monitoring a voltage drop across a resistor, for example, an obtained output voltage is proportional to a current. In this case, as shown in FIG. 11, overcurrent values A and B are preset, and an overcurrent is determined when a current exceeds the set values. In this method, a current value to be actually detected changes because the resistance changes as indicated by lines a and b in FIG. 11 depending on a temperature change. For example, assume that the overcurrent value A is set on the basis of the line a and a protection circuit is operated by an output voltage Vout corresponding to the value A. In this case, when an actual resistance becomes the value indicated by the line b, the protection circuit is not operated unless the current B larger than the set overcurrent A flows. Therefore, the MOSFET cannot be effectively protected.

In the embodiment shown in FIGS. 5A and 5B, the above program does not arise because the breakdown voltage of the p-n junction diode is used to detect an overcurrent. This is because a variation in breakdown voltage of the p-n junction diode upon a temperature change is small.

In addition, in the fifth embodiment, the detection output voltage level is suppressed by the MOSFET. Therefore, the fifth embodiment is effective when the detection output voltage is input to a logic constituting the protection circuit.

FIGS. 6A and 6B show a sixth embodiment obtained by slightly modifying the above fifth embodiment. Referring to FIGS. 6A and 6B, the same reference numerals as in FIGS. 5A and 5B denote the same parts, and a detailed description thereof will be omitted. As is apparent from comparison between FIGS. 5B and 6B, an equivalent circuit of the sixth embodiment is identical to that of the fifth embodiment. In the sixth embodiment, an n-type buffer layer 31b is formed to be separated from an n-type drain layer 31a by a predetermined distance. The layers 31a and 31b are connected by wiring 35. A p+-type diffusion layer 33 is formed at a contact portion of the wiring 35 with the drain layer 31a, and an n+-type diffusion layer 36 is formed at a contact portion of the wiring 35 with the buffer layer 31b. That is, a p-n junction diode Di is formed between the n-type layer 31a and the p+-type layer 33. The positions of the layers 33 and 36 may be switched. In this case, the p-n junction diode Di is formed in the buffer layer 31b.

In the sixth embodiment, the same effects as in the above embodiments can also be obtained.

Figure 7A:
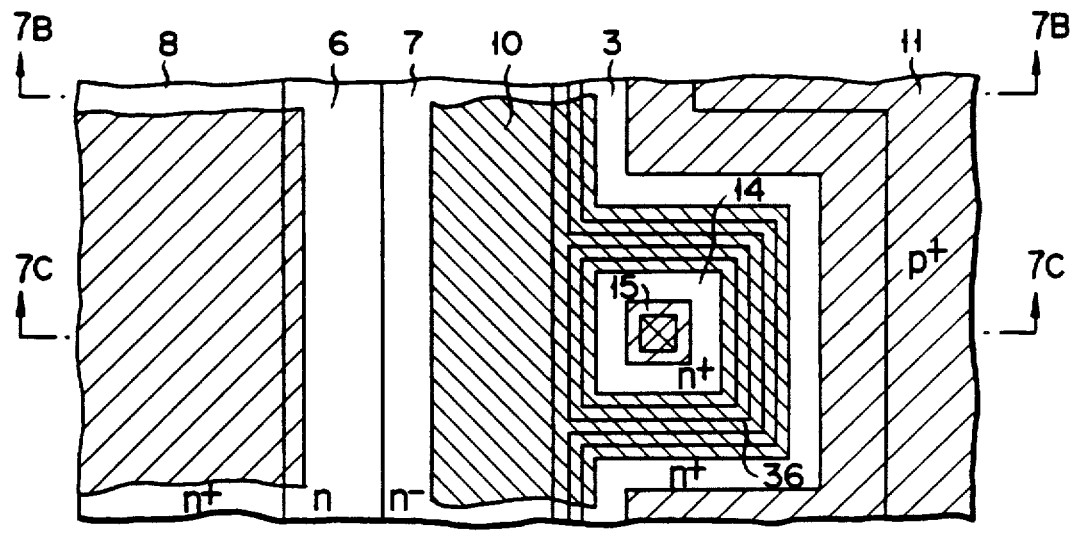
FIG. 7A is a plan view showing a structure of a MOSFET according to a seventh embodiment of the present invention.
Figure 7B:
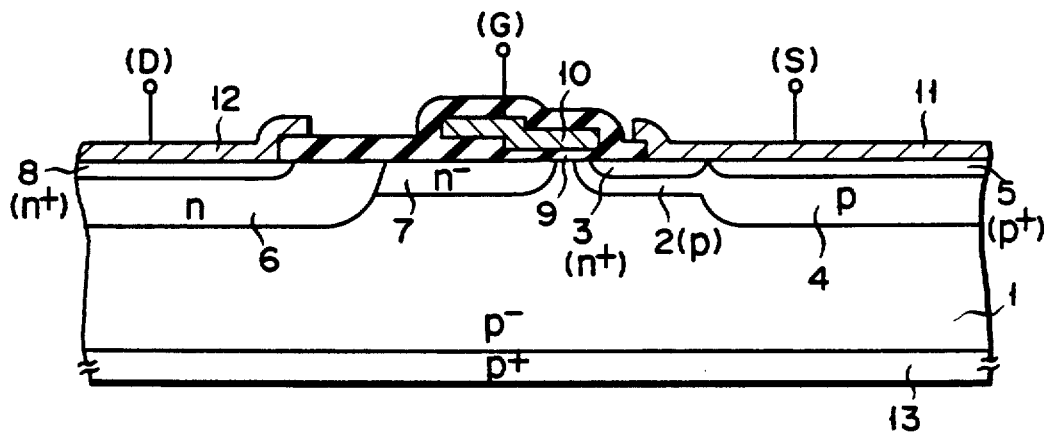
FIG. 7B is a sectional view taken along a line VIIB—VIIB of FIG. 7A.
Figure 7C:
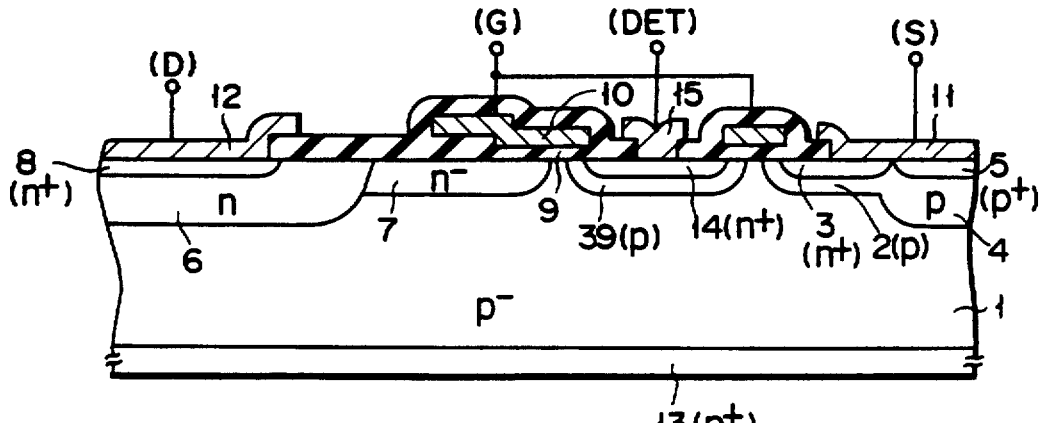
FIG. 7C is a sectional view taken along a line VIIC—VIIC of FIG. 7A.

FIGS. 7A, 7B and 7C show a seventh embodiment obtained by modifying the embodiment shown in FIGS. 1A, 1B and 1C. In the seventh embodiment, a p-type layer 39 is formed between a p-type base layer 2 and an n⁻-type drift layer 7. An n+-type voltage detection terminal layer 14 is formed in the surface layer of the layer 39, and a voltage detection electrode 15 is in contact with the terminal layer 14. A region between an n⁻-type drift layer 7 and an n-type source layer 3 formed around the terminal layer 14 serves as a channel layer. A gate insulating film 9 is formed on the channel region, and a gate electrode 10 is formed thereon.

In the seventh embodiment, when a voltage is applied on the gate electrode 10, the terminal layer 14 is electrically connected to the source electrode 11 via a channel resistance. When an overcurrent flows through the MOSFET, a voltage is output from the detection electrode 15 due to the channel resistance caused by the overcurrent, thereby detecting the overcurrent.

The arrangement of the seventh embodiment can be applied to not only a normal MOSFET but also a conductivity-modulation MOSFET.

Figure 8A:
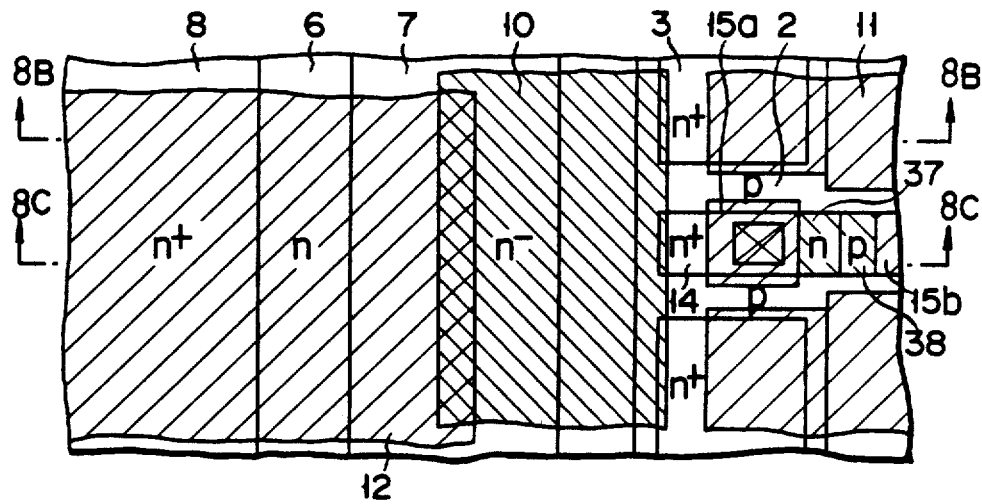
FIG. 8A is a plan view showing a structure of a MOSFET according to an eighth embodiment of the present invention.
Figure 8B:
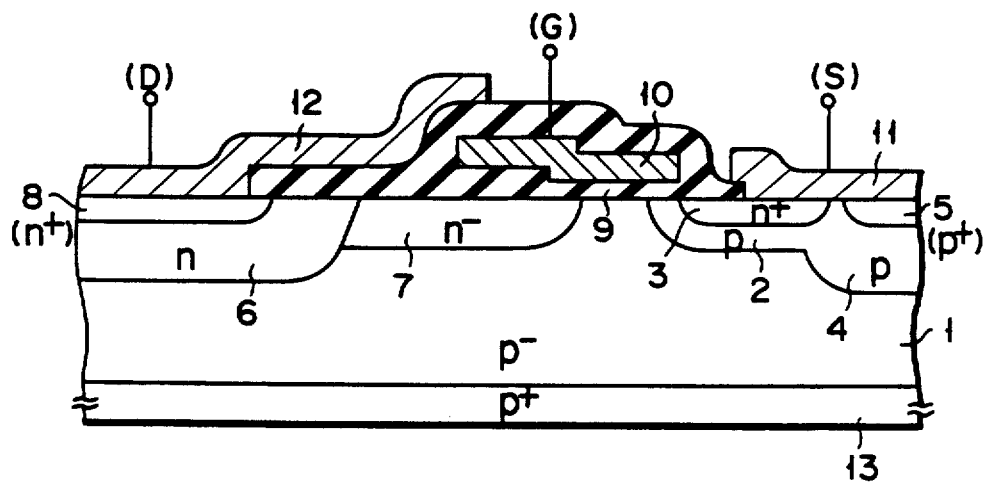
FIG. 8B is a sectional view taken along a line VIIIB—VIIIB of FIG. 8A.
Figure 8C:
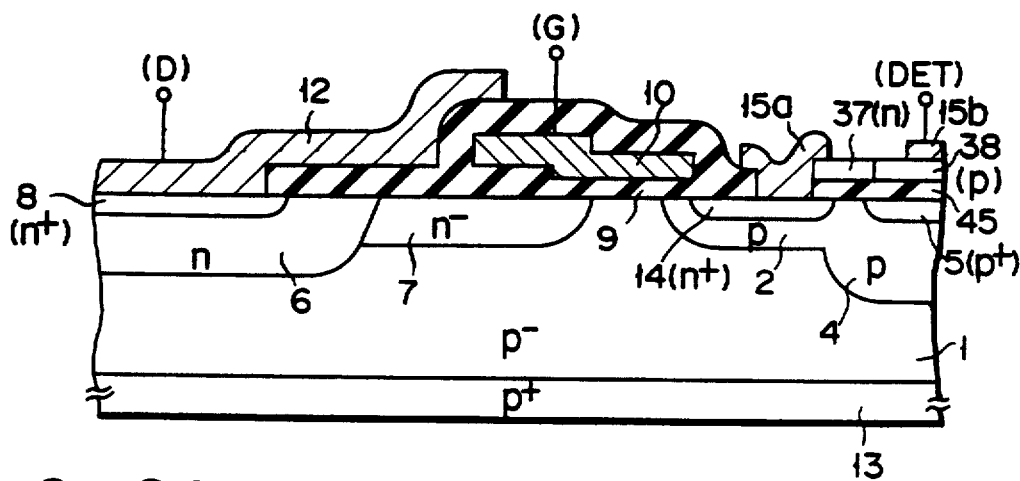
FIG. 8C is a sectional view taken along a line VIIIC—VIIIC of FIG. 8A.

FIGS. 8A, 8B and 8C show an eighth embodiment similarly obtained by modifying the embodiment shown in FIGS. 1A, 1B and 1C. In the eighth embodiment, a primary detection electrode 15a corresponds to the voltage detection electrode 15 of the embodiment shown in FIGS. 1A, 1B and 1C. A secondary detection electrode 15b is formed above an insulating film 45, thereby forming a p-n junction diode consisting of a polycrystalline film between the primary and secondary electrodes 15a and 15b. The polycrystalline silicon film is formed on the insulating film 45, and the diode is constituted by an n-type layer 37 and a p-type layer 38.

In the eighth embodiment, the p-n junction diode is connected in series with the voltage detection electrode 5 of the embodiment shown in FIGS. 1A, 1B and 1C. That is, the terminal is extracted via the p-n junction diode. This p-n junction diode serves similarly to that formed at the drain side of the overcurrent detection MOSFET in the embodiments shown in FIGS. 5A and 6A. That is, when an overcurrent flows, an output voltage appears in the detection electrode 15b if a voltage across the drain and source exceeds the breakdown voltage of the p-n junction diode.

According to the eighth embodiment of the present invention, therefore, the same effects as in the embodiment shown in FIG. 5A or 6A can be obtained. In addition, since the p-n junction diode consisting of a polycrystalline silicon film can be formed simultaneously with formation of a gate electrode, fabrication steps are not complicated.

The arrangement of the eighth embodiment can also be applied to a conductivity-modulation MOSFET in addition to a normal MOSFET.

Figure 9A:
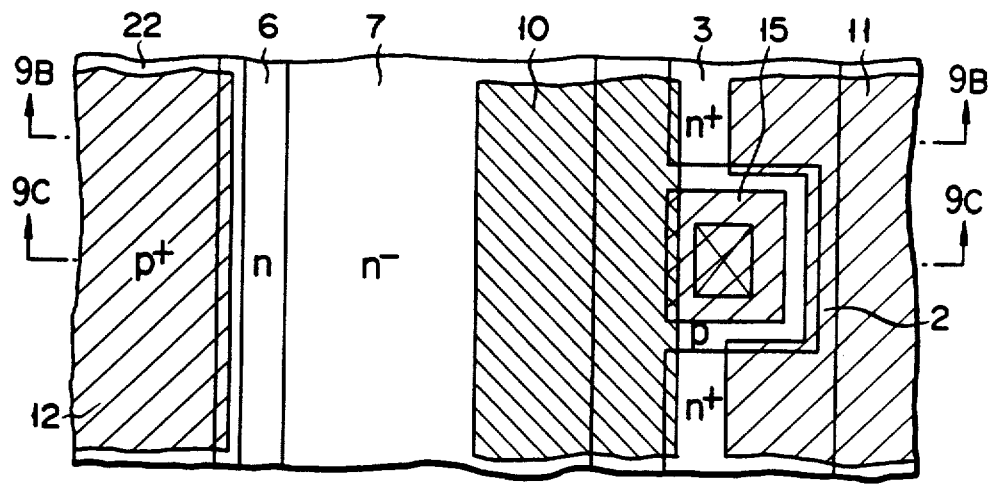
FIG. 9A is a plan view showing a structure of a MOSFET according to a ninth embodiment of the present invention.
Figure 9B:
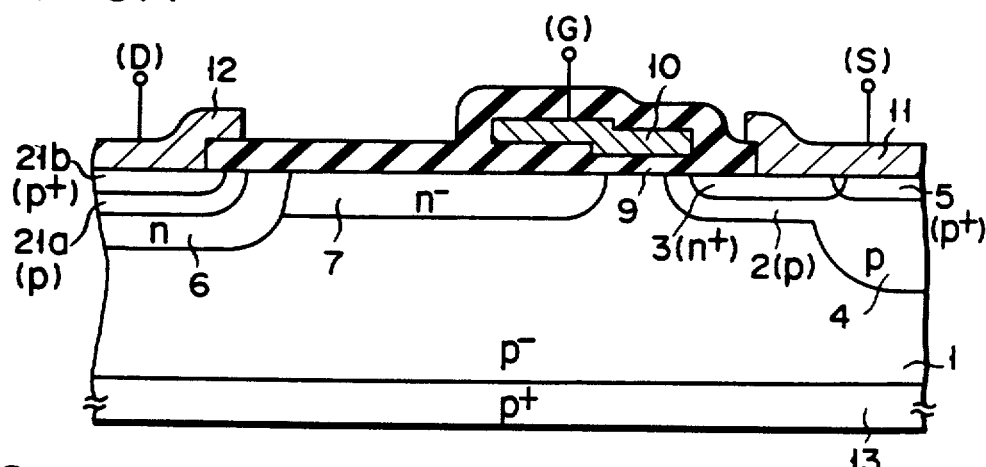
FIG. 9B is a sectional view taken along a line IXB—IXB of FIG. 9A.
Figure 9C:
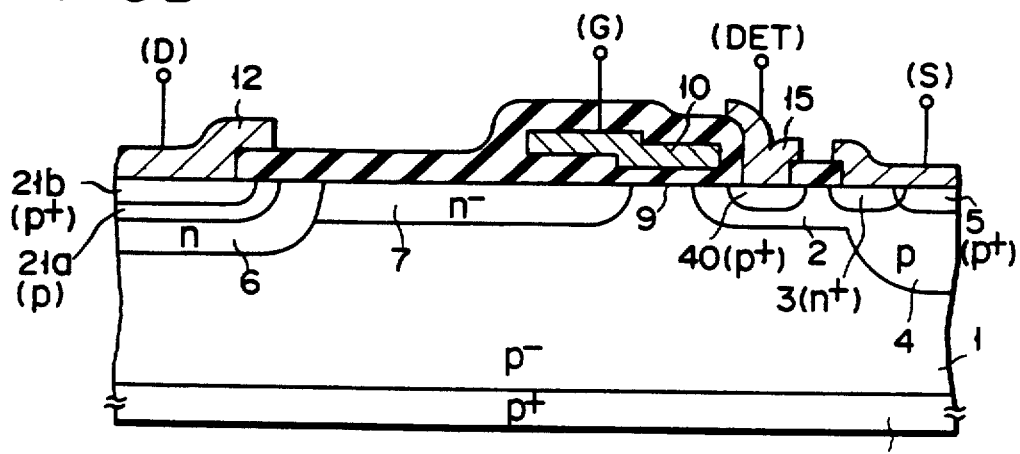
FIG. 9C is a sectional view taken along a line IXC—IXC of FIG. 9A.

FIGS. 9A, 9B and 9C show a ninth embodiment obtained by slightly modifying the embodiment shown in FIGS. 2A, 2B and 2C. In the ninth embodiment, a p+-type voltage detection terminal layer 40 is formed at a portion of a high-resistance base layer 2 in a p-type base layer 4, and a voltage detection electrode 15 is in contact with the terminal layer 40.

In the ninth embodiment, an overcurrent is detected by detecting a potential of the base layer 2 present before a source layer 3. Therefore, an application element of the ninth embodiment is limited to a conductivity-modulation MOSFET. In the conductivitymodulation MOSFET, a hole current flows at the same time an electron current flows upon turning on of the MOSFET. When an overcurrent flows through the conductivitymodulation MOSFET, since a large hole current flows through the base layer 2, the potential of the layer 2 rises. Therefore, the overcurrent can be detected by detecting a potential rise of the base layer 2.

Figure 10:
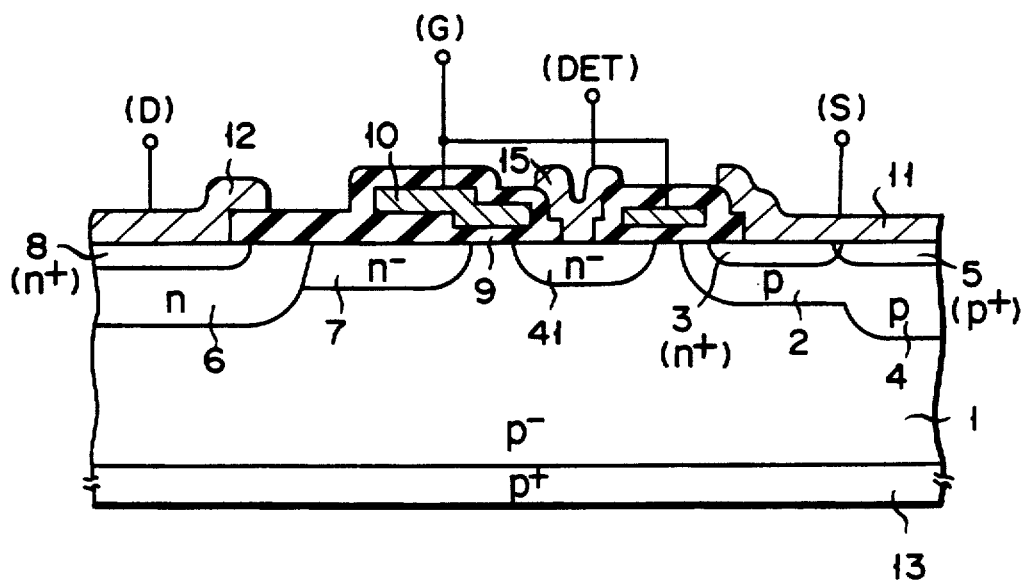
FIG. 10 is a sectional view showing a MOSFET according to a tenth embodiment of the present invention.

FIG. 10 shows a MOSFET according to a tenth embodiment obtained by simplifying the arrangement shown in FIGS. 7A, 7B and 7C. In the tenth embodiment, a part of an n⁻-type drift layer 7 is divided to form a voltage detection terminal layer 41 consisting of an n⁻-type layer between a p-type base layer 2 and the drift layer 7. A voltage detection electrode 15 is in contact with the terminal layer 41. In order to electrically connect the terminal layer 41 to an n+-type source layer 3 and the drift layer 7 via channel, a gate electrode 10 is formed around the terminal layer 41. The gate electrode 10 is formed on a gate insulating film 9.

In the tenth embodiment, as in the embodiment shown in FIGS. 7A, 7B and 7C, when an overcurrent flows through the MOSFET, a potential in the channel rises. Therefore, this potential rise is detected by the detection electrode 15. The arrangement of the tenth embodiment can also be applied to not only a normal MOSFET but also to a conductivity-modulation MOSFET.

Figure 12:
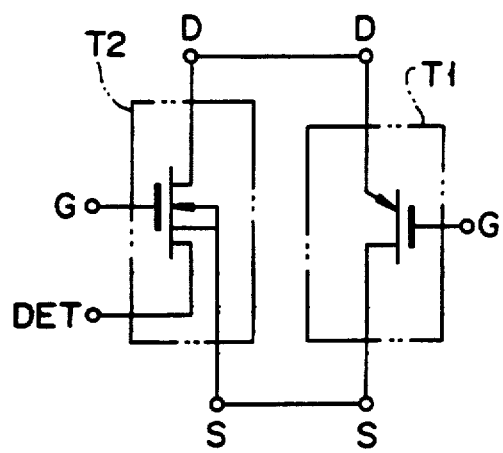
FIG. 12 is an equivalent circuit diagram in which a main MOSFET and an overcurrent detection MOSFET are arranged independently of each other.

In the embodiments shown in FIGS. 5A and 6A, the conductivity-modulation MOSFET T1 as a main MOSFET and the overcurrent detection MOSFET T2 are formed on the same wafer with a common p-type base layer. The MOSFETs T1 and T2, however, may be formed on different wafers and then connected via wiring In the case of a conductivity-modulation MOSFET not incorporating a p-n junction diode for voltage detection, as shown in FIG. 12, the conductivity-modulation MOSFET T1 as a main MOSFET and the overcurrent detection MOSFET T2 can be formed on the same wafer by separating their drain layers. Alternatively, the conductivity-modulation MOSFET T1 and the overcurrent detection MOSFET T2 may be formed on different wafers and then connected via wiring. The same arrangement can be adopted when the main MOSFET is a normal MOSFET.

FIG. 13 shows an 11th embodiment of a MOSFET including a protection circuit according to the present invention. The 11th embodiment exemplifies a conductivity-modulation MOSFET T having a voltage detection terminal DET for detecting an overcurrent. As shown in FIG. 13, the MOSFET T is inserted in a circuit including a load 55 and a power source 54. A control signal is supplied to a gate terminal G of the conductivity-modulation MOSFET via a waveform shaping circuit 53. A transistor Q for short-circuiting the gate terminal G and a source terminal S is formed therebetween. The voltage detection terminal DET of the MOSFET T is connected to a level detection circuit 51. An output from the circuit 51 is supplied to the base of the transistor Q via a waveform shaping circuit 52.

Figure 14:
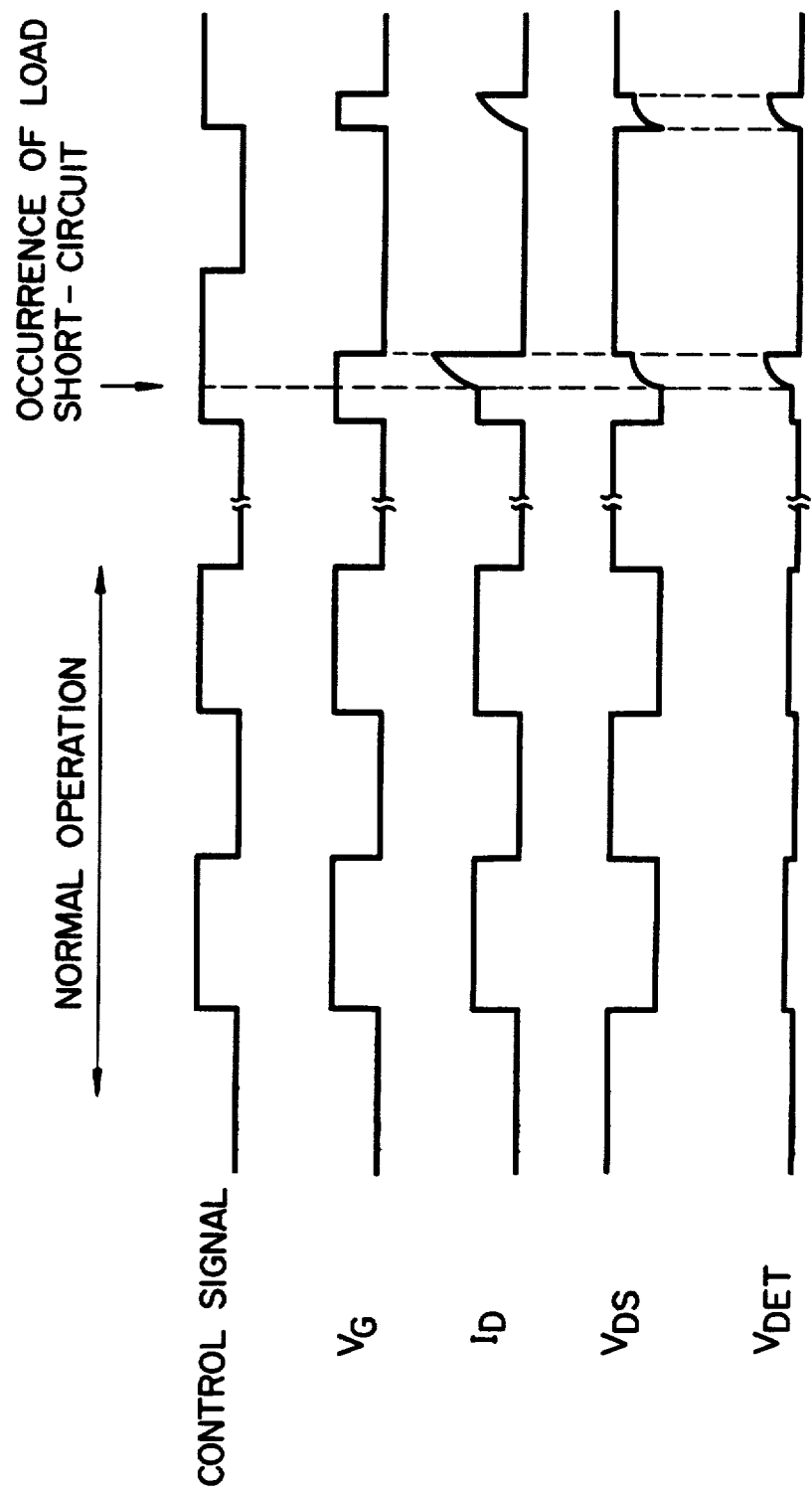
FIG. 14 is a timing chart for explaining an operation of the circuit shown in FIG. 13.

An operation of the above circuit will be described with reference to FIG. 14. An input control signal as shown in FIG. 14 is supplied to the gate G of the MOSFET T via the circuit 53. As a result, the MOSFET T is turned on or off. At this time, a voltage corresponding to a current flowing through the MOSFET T is output from its terminal DET. The circuit 51 does not generate an output signal unless the output value exceeds a value set by the circuit 51. This is a normal operation.

If, for example, an accident such as short-circuiting of the load 55 or the like occurs to cause an overcurrent to flow through the MOSFET T, a high voltage is output from the terminal DET. When this voltage exceeds the value set by the circuit 51, the circuit 51 generates an output signal. This output signal is supplied to the base terminal of the transistor Q via the circuit 52. As a result, the transistor Q is turned on, and a gate-source path of the MOSFET T is forcibly short-circuited. Therefore, the MOSFET T is turned off. Since an output voltage from the terminal DET falls when the MOSFET T is turned off, the transistor Q is turned off. Therefore, even when the control signal is supplied to the MOSFET T again to turn it on, an overcurrent can be detected by the above operation. In this manner, the conductivity-modulation MOSFET T is protected against breakdown caused by an overcurrent.

FIG. 15 shows a MOSFET including another protection circuit according to a 12th embodiment of the present invention. The 12th embodiment includes a gate means for not only turning off an element to be protected against an overcurrent but also inhibiting input of a control signal. Referring to FIG. 15, the same reference numerals as in FIG. 13 denote the same parts, and a detailed description thereof will be omitted. In the 12th embodiment, a conductivity-modulation MOSFET T1 as a main MOSFET to be protected and an overcurrent detection MOSFET T2 are formed on the same or different wafers. A control signal is supplied to a 2-input AND gate 56. An output from the AND gate 56 is supplied to commonly connected gate electrodes G1 and G2 via a waveform shaping circuit 53. The output from the AND gate 56 is also supplied to a 2-input AND gate 57 via a delay circuit 58. An output from a level detection circuit 51 is also supplied to the AND gate 57. An output from the AND gate 57 is used to turn off the MOSFET T1 and inhibit input of the control signal. That is, the output from the AND gate 57 is supplied to the base of a transistor Q via a waveform shaping circuit 52. The transistor Q is located between the gate and source of the MOSFET T1 to be protected. The output from the AND gate 57 is supplied to a latch circuit 59, and an output from the circuit 59 is supplied to one input terminal of the AND gate 56 via an inverter 60.

Figure 16:
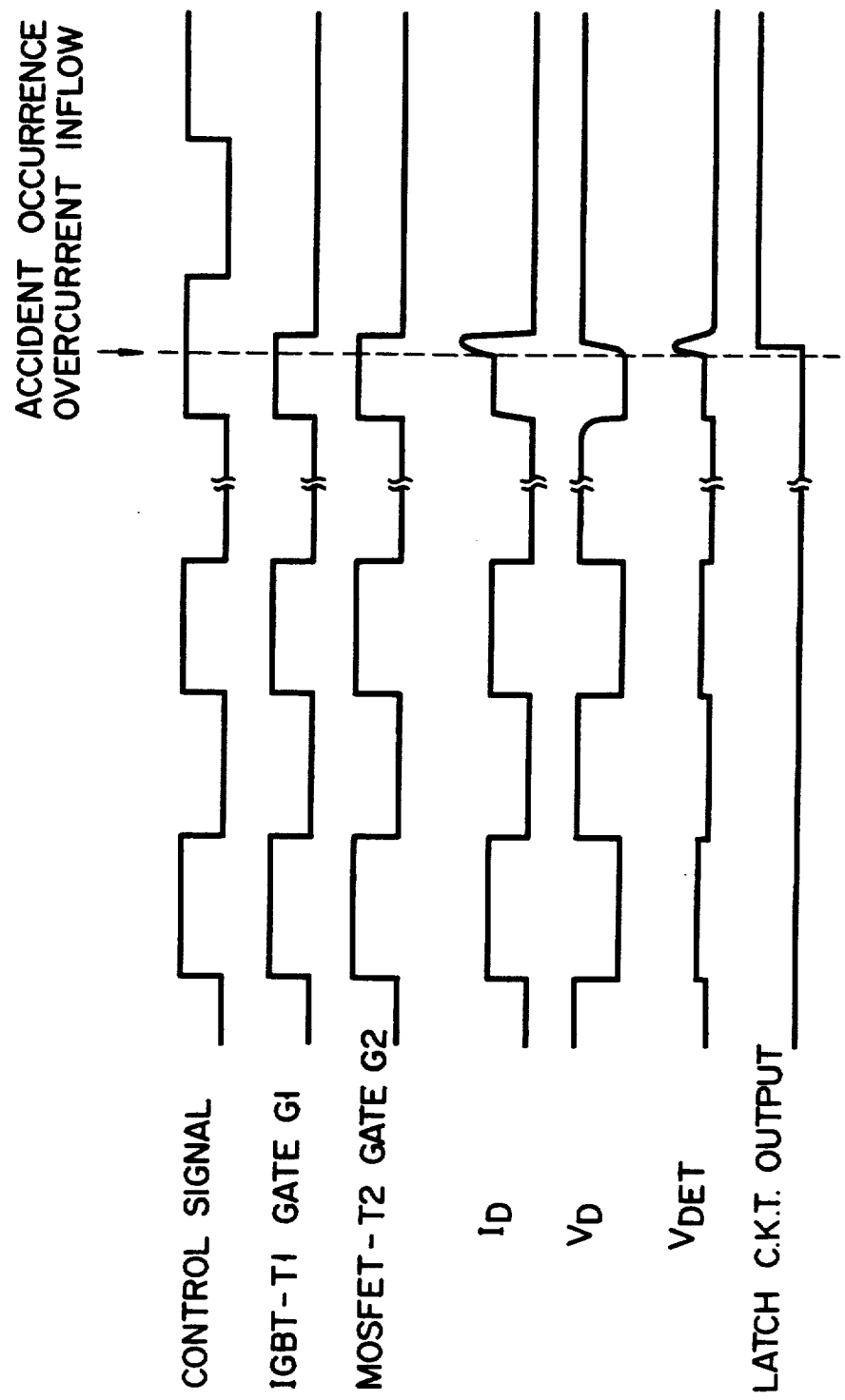
FIG. 16 is a timing chart for explaining an operation of the circuit shown in FIG. 13.

An operation of the protection circuit having the above arrangement will be described below with reference to FIG. 16. In a normal operation, since the latch circuit 59 is reset, an output from the circuit 59 is at "L" level. Therefore, "H" level obtained by inverting the "L" level by the inverter 60 is supplied to the AND gate 56. In this state, a control signal of "H" level passes through the AND gate 56 and is supplied to the gate terminals G1 and G2 of the element via the waveform shaping circuit 53. As a result, the MOSFETs T1 and T2 are turned on. In this case, since a delay time is present before the MOSFET T1 is turned on, a voltage across the drain and source becomes substantially equal to a power source voltage during this delay time. As a result, a high voltage proportional to a voltage across the drain and source of the MOSFET T2 is applied to its terminal DET. Therefore, a voltage at the terminal DET may exceed the threshold value of the level detection circuit 51 to cause the circuit 51 to generate an output signal. In this embodiment, however, the delay circuit 58 prevents the protection circuit from being operated by the output signal from the circuit 51. That is, the output from the AND gate 56 is supplied to the AND gate 57 with a predetermined delay by the delay circuit 58. If this delay time is set longer than the delay of an ON timing of the MOSFET T1, the two inputs of the AND gate 57 cannot be set at "H" level at the same time even when an "H"-level output is obtained from the circuit 51. Therefore, no "H"-level output for turning off the MOSFET T1 and inhibiting input of the control signal can be obtained. As a result, an ON/OFF operation of the MOSFET T1 can be controlled in accordance with the control signal.

When an overcurrent flows through the MOSFET T1 by, e.g., an accident such as short-circuiting of the load 55, a high output voltage appears at the terminal DET and supplied to the AND gate 57. In this case, unlike in the initial stage of ON operation, the control signal is already set at "H" level. In addition, since the other input of the AND gate 57 is at "H" level, a logical AND condition is established. As a result, an "H"-level output is obtained from the AND gate 57. This "H"-level output is supplied to the base terminal of the transistor Q via the waveform shaping circuit 52. Therefore, the transistor Q is turned on to short-circuit a gate-source path of the MOSFET T1, thereby turning off the MOSFET T1. Since the H-level output from the AND gate 57 is latched by the latch circuit 59, an output from the circuit 59 is fixed at "H" level. This "H" level is inverted by the inverter 60, and an "L"-level signal is supplied to one input terminal of the AND gate 56. As a result, the control signal of "H" level is inhibited from passing through the AND gate 56 thereafter. This state is held until a reset signal is supplied to the latch circuit 59.

According to the 12th embodiment, when the conductivity-modulation MOSFET is turned off upon detection of an overcurrent, input of the control signal is inhibited thereafter. The conductivity-modulation MOSFET is not turned on unless the circuit is reset. Therefore, breakdown of the MOSFET can be prevented more reliably than the above embodiments.

Figure 17:
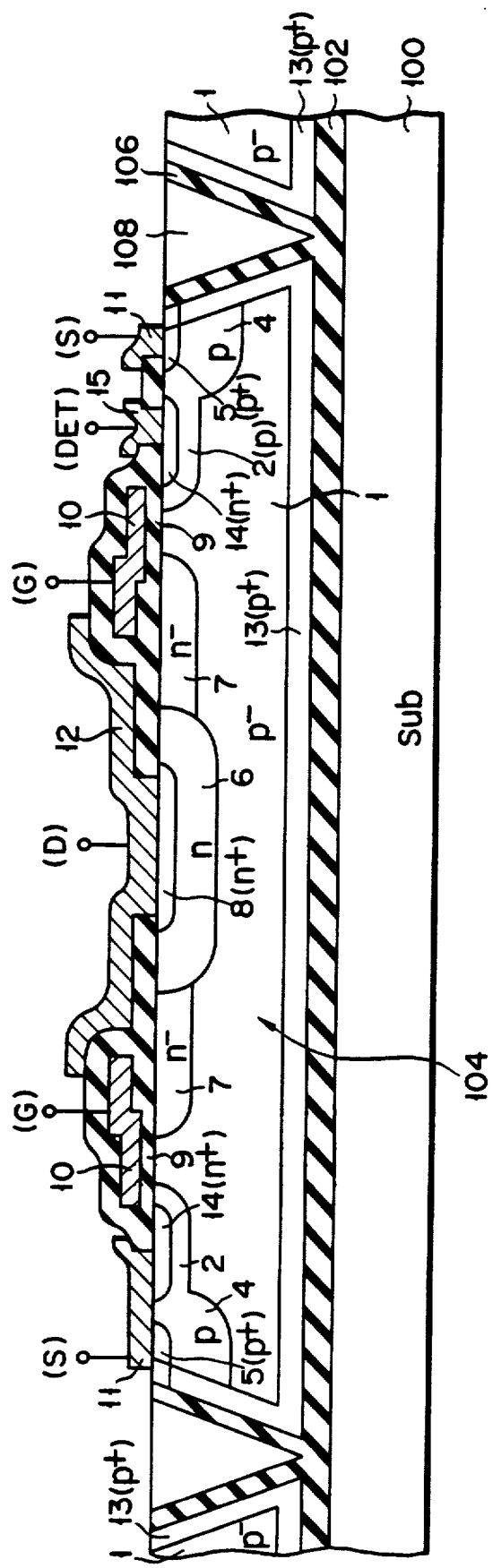
FIG. 17 is a sectional view showing a structure of a MOSFET according to a 13th embodiment of the present invention.

A MOSFET according to a 13th embodiment of the present invention will be described below with reference to FIG. 17. An insulating layer 102 is formed on a semiconductor substrate 100. A semiconductor layer 104 for forming a MOSFET is formed on the insulating layer 102. A so-called bonding method is used to obtain a structure as shown in FIG. 17. More specifically, a first oxide film is formed on the surface of the substrate 100, and a second oxide film is formed on the surface of the semiconductor layer 104. The first and second oxide films are superposed on each other and a heat treatment about 500° C. to 1200° C. is applied to the substrate 100 and the layer 104, thereby forming a structure in which the insulating layer 102 is sandwiched between the substrate 100 and the semiconductor layer 104. The layer 104 is isolated by an insulating film 106 and polysilicon 108. An arrangement of a MOSFET formed in an island region will be described below. The arrangement of this MOSFET is basically the same as that of the first embodiment.

A high-resistance $p^-$-type Si layer 1 is formed on a $p^+$-type silicon layer 13, and a p-type base layer 2 is selectively formed in the surface layer of the Si layer 1. An $n^+$-type source layer is formed in the surface layer of the base layer 2. A low-resistance p-type layer 4 is formed at a portion of the base layer 2 separated from a channel region, and a $p^+$-type contact layer 5 is formed in its surface of p-type layer 4. An n-type buffer layer 6 is formed at a position in the surface layer of the Si layer 1 separated from the base layer 2 by a predetermined distance, and an $n^+$-type drain layer 8 is formed in its surface of buffer layer 6. An $n^-$-type drift layer 7 extending from the buffer layer 6 to a channel side is formed on the surface of the Si layer 1. A gate insulating film 9 is formed across the base layer 2 and the drift layer 7, and a gate electrode 10 is formed thereon. A source electrode 11 is in contact with the $n^+$-type source layer and the contact layer 5. A drain electrode 12 is in contact with the drain layer 8 such that a part of the electrode 12 overlaps the gate electrode 10. An $n^+$-type voltage detection terminal layer 14 is formed in the base layer 2 so as to be isolated from the $n^+$-type source layer, and a voltage detection electrode 15 is in contact with the terminal layer 14.

According to this embodiment, an advantage similar to those of the above embodiments can be obtained.

Figure 18D:
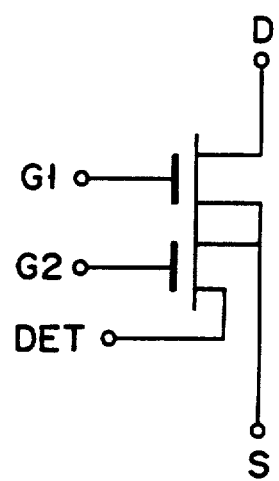
FIG. 18D is an equivalent circuit diagram of the MOSFET shown in FIGS. 18A to 18C.

FIGS. 18A, 18B, 18C and 18D show a MOSFET according to a 14th embodiment of the present invention. Referring to FIGS. 18A, 18B and 18C, the same reference numeral as in FIGS. 1A, 1B and 1C denote the same parts, and a detailed description thereof will be omitted. In this embodiment, a specific gate electrode 10a is formed above the surface layer of a $p^-$-type layer 1 and a p-type base layer 2 sandwiched between an $n^+$-type voltage detection terminal layer 14 and an $n^-$-type drift layer 7. Gate electrode 10a is isolated from a gate electrode 10.

Anyway, ON voltage decreases as a gate voltage increases. A peak voltage value output to voltage detection terminal layer 14, however, becomes substantially equal to the value of gate electrode. For example, when an overcurrent flows through MOSFET by applying 15 V to the gate electrode, about 15 V is output to voltage detection terminal layer 14. Since a logic circuit for receiving this voltage from voltage detection terminal 14 to protect the MOSFET is normally driven by 5 V, an output of 15 V is overvoltage for the logic circuit.

In this embodiment, however, the specific gate electrode 10a is provided. Then, the voltage applied to gate electrode 10a enables to be different from the voltage applied to gate electrode 10. When a high gate voltage of 15 V is applied to gate electrode 10 and a low gate voltage of 5 V is applied to gate electrode 10a a low ON voltage can be obtained and an output voltage from voltage detection terminal 14 in case of flowing an overcurrent can be maintained at about 5 V. That is, the output voltage from voltage detection terminal 14 can be freely set by the voltage applied to specific gate electrode 10a.

According to the present invention as has been described above, normal and conductivity-modulation MOSFETs having an overcurrent detection function and a simple structure can be obtained.

What is claimed is:

1. A MOSFET comprising:
   a high-resistance semiconductor layer;
   a base layer of a first conductivity type selectively formed in a surface layer of said high-resistance semiconductor layer;
   a source layer of a second conductivity type selectively formed in a surface layer of said base layer of the first conductivity type;
   a drain layer of the second conductivity type formed in one of front and rear surface layers of said high-resistance semiconductor layer so as to be separated from said base layer by a predetermined distance;
   a gate insulating film formed on a channel region of said base layer;
   a gate electrode formed on said gate insulating film;
   a voltage detection terminal layer of the second conductivity type formed in said base layer so as to be isolated from said source layer;
   a source electrode which is in contact with said source and base layers;
   a drain electrode which is in contact with said drain layer; and
   a voltage detection electrode which is in contact with said voltage detection terminal layer.

2. A MOSFET comprising:
   a high-resistance semiconductor layer;
   a base layer of a first conductivity type selectively formed in a surface layer of said high-resistance semiconductor layer;
   a source layer of a second conductivity type selectively formed in a surface layer of said base layer;
   a drain layer of the second conductivity type formed in the surface layer of said high-resistance semiconductor layer so as to be separated from said base layer by a predetermined distance;
   a high-resistance drift layer of the second conductivity type, formed between said drain and source layers, and connected to said drain layer;
   a gate insulating film formed across said base and high-resistance drift layers;
   a gate electrode formed on said gate insulating film;
   a voltage detection terminal layer of the second conductivity type formed in said base layer so as to be isolated from said source layer;
   a source electrode which is in contact with said source and base layers;
   a drain electrode which is in contact with said drain layer; and
   a voltage detection electrode which is in contact with said voltage detection terminal layer.

3. A lateral conductivity-modulation MOSFET comprising:
   a high-resistance semiconductor layer;
   a first base layer of a first conductivity type selectively formed in a surface layer of said highresistance semiconductor layer;
   a source layer of a second conductivity type selectively formed in a surface layer of said first base layer;
   a second base layer of the second conductivity type formed in the surface layer of said high-resistance semiconductor layer so as to be separated from said first base layer by a predetermined distance;
   a high-resistance drift layer of the second conductivity type, formed between said first and second base layers, and connected to said second base layer;
   a drain layer of the first conductivity type selectively formed in a surface layer of said second base layer;
   a gate insulating film formed across said first base layer and said high-resistance drift layer;
   a gate electrode formed on said gate insulating film;
   a voltage detection terminal layer of the second conductivity type formed in said first base layer so as to be isolated from said source layer; and
   a voltage detection electrode which is in contact with said voltage detection terminal layer.

4. A vertical conductivity-modulation MOSFET comprising:
   a drain layer of a first conductivity type;
   a high-resistance base layer of a second conductivity type formed over said drain layer of the first conductivity type;
   a base layer of the first conductivity type selectively formed in a surface layer of said high-resistance base layer of the second conductivity type;
   a source layer of the second conductivity type selectively formed in a surface layer of said base layer of the first conductivity type;
   a gate insulating film formed on a portion of said base layer of the first conductivity type located between said source layer of the second conductivity type and said high-resistance base layer of the second conductivity type;
   a gate electrode formed on said gate insulating film;
   a voltage detection terminal layer of the second conductivity type formed in said base layer of the first conductivity type so as to be isolated from said source layer;
   a source electrode which is in contact with said source and base layer;
   a drain electrode which is in contact with said drain layer; and
   a voltage detection electrode which is in contact with said voltage detection terminal layer.

5. A vertical conductivity-modulation MOSFET comprising:
   a drain layer of a first conductivity type;
   a high-resistance base layer of a second conductivity type formed over said rain layer of the first conductivity type;

a base layer of the first conductivity type selectively formed in a surface layer of said high-resistance base layer of the second conductivity type;

a source layer of the second conductivity type selectively formed in a surface layer of said base layer of the first conductivity type;

a gate insulating film formed on a portion of said base layer of the first conductivity type located between said source layer of the second conductivity type and said high-resistance base layer of the second conductivity type;

a gate electrode formed on said gate insulating film;

a voltage detection terminal layer of the first conductivity type formed in the surface layer of said high-resistance base layer of the second conductivity type so as to be isolated from said base layer of the first conductivity type; and a voltage detection electrode which is in contact with said voltage detection terminal layer.

6. A MOSFET comprising:

a main MOSFET including, a high-resistance semiconductor layer, a base layer of a first conductivity type selectively formed in a surface layer of said high-resistance semiconductor layer, a source layer of a second conductivity type selectively formed in a surface layer of said base layer, a drain layer formed in one of front and rear surface layers of said high-resistance semiconductor layer so as to be separated from said base layer by a predetermined distance, a gate insulating film formed on said base layer, and a gate electrode formed on said gate insulating film; and a MOSFET for detecting an overcurrent flowing through said main MOSFET, a drain layer of said overcurrent detection MOSFET being isolated from at least said drain layer of said main MOSFET; said overcurrent detection MOSFET having source, drain and gate electrodes, said source, drain and gate electrodes being commonly connected to source, drain and gate electrodes of said main MOSFET, respectively, said source electrode of said overcurrent detection MOSFET being connected to said base layer of the first conductivity type, said overcurrent detection MOSFET having a voltage detection electrode independent from said source electrode of said main MOSFET, said voltage detection electrode being formed in said source layer of the second conductivity type, said overcurrent detection MOSFET having a p-n junction diode between said drain layer and said drain electrode, and said p-n junction diode having a layer of the second conductivity type at a drain electrode side.

7. A MOSFET comprising:

a main MOSFET including, a high-resistance semiconductor layer, a base layer of a first conductivity type selectively formed in a surface layer of said high-resistance semiconductor layer, a source layer of a second conductivity type selectively formed in a surface layer of said base layer, a drain layer formed in one of front and rear surface layers of said high-resistance semiconductor layer so as to be separated from said base layer by a predetermined distance, a gate insulating film formed on said base layer, and a gate electrode formed on said gate insulating film; and a MOSFET for detecting an overcurrent flowing through said main MOSFET, a drain layer of said overcurrent detection MOSFET being isolated from said drain layer of said main MOSFET, said overcurrent detection MOSFET having source, drain and gate electrodes, said source, drain and gate electrodes of said overcurrent detection MOSFET being commonly connected to source, drain and gate electrodes of said main MOSFET, respectively, said source electrode of said overcurrent detection MOSFET being connected to said base layer of the first conductivity type, said overcurrent detection MOSFET having a voltage detection electrode independent from said source electrode of said main MOSFET, said voltage detection electrode being in contact with said source layer of the second conductivity type, said overcurrent detection MOSFET having said drain layer of the second conductivity type, a buffer layer of the second conductivity type separated from said drain layer of the second conductivity type by a predetermined distance, and wiring for connecting said drain layer of the second conductivity type to said buffer layer of the second conductivity type, and a p-n junction diode being formed, via a layer of the first conductivity type, at a portion at which one of said drain layer of the second conductivity type and said buffer layer of the second conductivity type is in contact with said wiring.

8. A MOSFET according to claim 6, wherein a highresistance drift layer of the second conductivity type is formed in contact with said drain layers of said main and overcurrent detection MOSFETs.

9. A MOSFET according to claim 7, wherein a highresistance drift layer of the second conductivity type is formed in contact with said drain layers of said main and overcurrent detection MOSFETs.

10. A MOSFET according to claim 6, wherein said main MOSFET is a conductivity-modulation MOSFET having a drain layer of the first conductivity type surrounded by a buffer layer of the second conductivity type.

11. A MOSFET according to claim 7, wherein said main MOSFET is a conductivity-modulation MOSFET having a drain layer of the first conductivity type surrounded by a buffer layer of the second conductivity type.

12. A MOSFET according to claim 8, wherein said main MOSFET is a conductivity-modulation MOSFET having a drain layer of the first conductivity type surrounded by a buffer layer of the second conductivity type.

13. A MOSFET comprising:

a high-resistance semiconductor layer;

a base layer of a first conductivity selectively formed in a surface layer of said high-resistance semiconductor layer;

a source layer of a second conductivity type selectively formed in a surface layer of said base layer;

a drain layer formed in one of front and rear surface layers of said high-resistance semiconductor layer so as to be separated from said base layer by a predetermined distance;

a diffusion layer of the first conductivity type formed independently of and adjacent to said base layer of the first conductivity type;

a voltage detection terminal layer of the second conductivity type formed in a surface layer of said diffusion layer;

a voltage detection electrode which is in contact with said voltage detection terminal layer;

a gate insulating film formed on said base layer; and a gate electrode formed on said gate insulating film, said gate electrode extending, via said gate insulating film, over a surface of a region sandwiched between said voltage detection terminal layer and said source layer.

14. A MOSFET comprising:

a high-resistance semiconductor layer;

a base layer of a first conductivity type selectively formed in a surface layer of said high-resistance semiconductor layer;

a source layer of a second conductivity type selectively formed in a surface layer of said base layer;

a drain layer formed in one of front and rear surface layers of said high-resistance semiconductor layer so as to be separated from said base layer by a predetermined distance;

a gate insulating film formed on said base layer;

a gate electrode formed on said gate insulating film;

a voltage detection terminal layer of the second conductivity type formed in said base layer of the first conductivity type so as to be isolated from said source layer;

a primary voltage detection electrode which is in contact with said voltage detection terminal layer;

a p-n junction diode consisting of a polycrystalline silicon film, one terminal of said p-n junction diode being connected to said primary voltage detection electrode, and said p-n junction diode being formed on an insulating film; and a secondary voltage detection electrode connected to the other terminal of said p-n junction diode.

15. A MOSFET comprising:

a high-resistance semiconductor layer;

a base layer of a first conductivity type selectively formed in a surface layer of said high-resistance semiconductor layer;

a source layer of a second conductivity type selectively formed in a surface layer of said base layer;

a drain layer formed in one of front and rear surface layers of said high-resistance semiconductor layer so as to be separated from said base layer by a predetermined distance;

a gate insulating film formed on said base layer;

a gate electrode formed on said gate insulating film; and a voltage detection electrode formed on a surface of a high-resistance layer portion of said base layer of the first conductivity type sandwiched between said source layer of the second conductivity type and said gate electrode.

16. A MOSFET comprising:

a high-resistance semiconductor layer;

a base layer of a first conductivity type selectively formed in a surface layer of said high-resistance semiconductor layer;

a source layer of a second conductivity type selectively formed in a surface layer of said base layer;

a drain layer of the second conductivity type formed in the surface layer of said high-resistance semiconductor layer so as to be separated from said base layer by a predetermined distance;

a high-resistance drift layer of the second conductivity type, formed between said base and drain layers, and connected to said drain layer;

a voltage detection terminal layer, formed between said base layer of the first conductivity type and said high-resistance drift layer, and including a highresistance layer of the second conductivity type;

a voltage detection electrode which is in contact with said voltage detection terminal layer;

a gate insulating film formed across said base layer and said high-resistance drift layer; and a gate electrode formed on said gate insulating film, said gate electrode extending, via said gate insulating film, over a surface of a region sandwiched between said voltage detection terminal and said base layer of the first conductivity type.

17. A MOSFET comprising:

a high-resistance semiconductor layer;

a base layer of a first conductivity type selectively formed in a surface layer of said high-resistance semiconductor layer;

a source layer of a second conductivity type selectively formed in a surface layer of said base layer of the first conductivity type;

a drain of layer of the second conductivity type formed in one of front and rear surface layers of said high-resistance semiconductor layer so as to be separated from said base layer by a predetermined distance;

a first gate insulating film formed on a channel region of said base layer;

a first gate electrode formed on said first gate insulating film;

a voltage detection terminal layer of the second conductivity type formed in said base layer so as to be isolated from said source layer;

a voltage detection electrode which is in contact with said voltage detection terminal layer;

a second gate insulating film formed on a surface of said high-resistance semiconductor layer and said base layer between said drain layer and said voltage detection terminal layer; and a second gate electrode formed on said second gate insulating film so as to be isolated from said first gate electrode.

* * * * *